US009116039B2

United States Patent
Shkunov et al.

(10) Patent No.: US 9,116,039 B2
(45) Date of Patent: Aug. 25, 2015

(54) SENSOR INCLUDING DIELECTRIC METAMATERIAL MICROARRAY

(71) Applicant: RAYTHEON COMPANY, Waltham, MA (US)

(72) Inventors: Vladimir V. Shkunov, San Pedro, CA (US); Robert W. Byren, Manhattan Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 133 days.

(21) Appl. No.: 13/974,313

(22) Filed: Aug. 23, 2013

(65) Prior Publication Data

US 2014/0263982 A1 Sep. 18, 2014

Related U.S. Application Data

(60) Provisional application No. 61/788,634, filed on Mar. 15, 2013.

(51) Int. Cl.
| | |
|---|---|
| *H01J 40/14* | (2006.01) |
| *G01J 5/08* | (2006.01) |
| *H01L 31/0232* | (2014.01) |
| *G01J 3/02* | (2006.01) |

(52) U.S. Cl.
CPC ............ *G01J 5/0806* (2013.01); *G01J 3/0208* (2013.01); *H01L 31/0232* (2013.01)

(58) Field of Classification Search
CPC ............................... G02B 1/002; G02B 1/007
USPC ........................................................ 250/216
See application file for complete search history.

(56) References Cited

U.S. PATENT DOCUMENTS 8,284,490 B2 10/2012 Byren et al.
2010/0072353 A1* 3/2010 Tschekalinskij et al. ..... 250/234

OTHER PUBLICATIONS

Greenwell, A. et al., "Multiple Wavelength Resonant Grating Filters Oblique Incidence with Broad Angular Acceptance", Optics Express, vol. 15, No. 14, Jul. 9, 2007, 13 pages.
Iazikov, Dimitri, "Nanostamps Offer Cost-Effective Nanoscale Surface Options", NewsBreaks, 1 page.
Raytheon Technology Today—Highlighting Raytheon's Technology, Issue 1, May 25, 2012, 64 pages.
Sentenac, A., et al, "Subdiffraction Light Focusing on a Grating Substrate", Physical Review Letters, vol. 101, No. 0219301, Jul. 4, 2008. 4 pages.

* cited by examiner

*Primary Examiner* — Thanh Luu
(74) *Attorney, Agent, or Firm* — Lando & Anastasi, LLP

(57) ABSTRACT

The present disclosure is directed to electromagnetic radiation sensors including micro-lenses and to methods of constructing and utilizing such electromagnetic radiation sensors. In one embodiment there is provided an electromagnetic radiation sensor comprising a dielectric substrate including a front surface and a rear surface, an electromagnetic radiation detector element disposed on the rear surface of the substrate, and a lens comprising a three dimensional polaritonic metamaterial structure including a pattern of features formed in the front surface of the substrate, the lens configured to focus electromagnetic radiation incident on the front surface of the substrate onto the electromagnetic radiation detector element.

21 Claims, 24 Drawing Sheets

SENSOR INCLUDING DIELECTRIC METAMATERIAL MICROARRAY

BACKGROUND

Micro-optics components are broadly used in devices for optical sensing, communications, fiber optics, integrated optics, silicon photonics, optic al interconnects, optical signal processing, etc. A micro-lens (ML) is an example of micro-optics component utilized in some pixelated imaging systems. In displays, the ML collimates light radiated by an individual pixel source. In detector focal plane arrays (FPA), micro-lenses can be positioned in front of individual pixels to collect light at an individual detector. Individual micro-lenses are commonly integrated into a separate component, a micro-lens array (MLA), immediately adjacent to the array of display emitters or FPA detectors.

Focusing of light occurs when the optical pathlength (OPL) of light rays passing through a lens varies laterally over the cross section of the lens. Under these conditions, the phasefront of a collimated incident light beam experiences a variable optical path difference (OPD). Conventional lenses are typically made of optically homogeneous glass such that the refractive index is constant inside the lens. The OPL variations are controlled by the geometry of the lens and depend on the lateral coordinates which correspond with variations in glass thickness. A positive lens is thicker near the lens center where lens thickness may, for example, be approximated as a parabolic function, yielding a parabolic shape for the OPD as well. Because of the sharp radius of curvature often desired in lenses for FPA detectors (less than about 1 cm), it is difficult to fabricate a conventional lens with a focus sharper than 100 diopters.

Micro-spheres and optical fibers can be used for focusing light to tiny light spots. Geometry of the shaped glass surface is responsible for focusing. Glass spheres, tens of micrometers in diameter, may provide the focusing strength desired in some FPAs. However, it is very difficult to fabricate a large number of spheres of a calibrated size, and to dispose them as a regular array. Micro-sphere arrays also generally exhibit a high insertion loss due to reflection near the boundaries between neighboring spheres due to the large incidence angles.

Fresnel lenses are also often used for micro optics, being much thinner and lighter as compared to regular lenses. They are made as concentric rings corresponding to Fresnel zones. The zones are separated by abrupt surface steps. Within each Fresnel ring, the surface shape is equivalent to the shape of conventional lens with the same focal distance, if made of the same material. Unconstrained, this design produces a truncated phasefront, instead of a smooth phasefront, resulting in diffractive losses. If the step discontinuities are an integral multiple of the wavelength, the resultant phase is smooth and the diffractive loss due to the transitions is negligible. The tolerances for manufacturing a Fresnel micro-lens are generally very tight. The depth of the surface steps may be on the order of a single wavelength, for example, less than a micron for optical lenses, while the curved surface between the steps must be figured with high precision. Diamond turning and digital control techniques are usually used for manufacturing Fresnel lenses. If the Fresnel lens is cut on a surface of a high-index semiconductor, which is typical material for FPA wafers, an impedance-matching, anti reflection coating applied to the lens surface is often used to reduce insertion loss. The effectiveness of typical antireflection coatings is a strong function of the angle of incidence, which may be quite large for low f/number imaging systems where these MLAs are used.

A Fresnel lens is normally round. Truncating a micro-lens element to fit a rectangular or hexagonal array unit cell shape results in sharp and irregular surface features that are difficult to fabricate for either a segmented or monolithic structure. For FPA applications, a spot size reduction of approximately a factor of two is often desired. Such focusing strength may only require a first Fresnel zone. Therefore, multi-zone Fresnel configurations may add unnecessary complexity relative to a conventional lens shape for FPA sensor applications.

An alternative to a shaped-surface lens is a gradient index (GRIN) lens. GRIN lenses are traditionally fabricated by bonding or fusing a number of glass rods together along their cylindrical surfaces in a regular array pattern, for example, rectangular or hexagonal. Each glass rod may be a few millimeters in length. The optical focusing power derives from using rods with different refractive indices in the array such that the refractive index of the assembly varies in a substantially smooth fashion as a function of radius from the center of the array. For positive focusing power, the refractive index is made denser near the lens center and drops down toward the periphery. After propagating a short distance, along the rod axis, the optical pathlength for different points of the cross section varies with the shape for the OPD, similar to a conventional lens. Index gradients are created by variations of glass composition from the rod center to its periphery, and the focusing power is limited by the maximum variation in refractive index that can be achieved with the glass chemical. Such lenses can be made approaching the thousand diopters level often desired for FPA applications, so that a collimated input beam will focus at the output surface of a few millimeters long rod. Arrays made of such GRIN rods or GRIN fibers, however, may be prohibitively bulky for an FPA micro-lens array application and require costly optical assembly and alignment processes.

Pixel separation (or pitch) for a typical FPA sensor depends on the wavelength of the radiation desired to be used for imaging. For long-wave and mid-wave infrared (IR) spectral bands, typical pixel pitches may be tens of micrometers. For visible and near-infrared spectral bands, pixel pitches may range down to micrometers. The Fresnel range $z_{Fr}$ is defined for a collimated light beam as the propagation distance over which diffraction results in an increase in the spot size diameter, such that the light intensity at the center is reduced by a factor of 2. The Fresnel range is of the order of hundreds of micrometers for such pixel dimensions. To focus incident light, the focal distance, F, of a lens should be significantly shorter than the Fresnel range. The Fresnel range also determines the focusing power for individual lens elements in a FPA micro-lens array, according to $1/F > 1/z_{Fr}$. The focusing power should therefore be strong, on the order of thousands of diopters. Standard commercial lenses are generally too bulky and have insufficient optical power for FPA applications as described herein. Accordingly, a micro-lens array is typically desirable for FPA applications. While it is possible to conceive of a micro-lens array as an assembly of individual lens elements, such small diameter and sharp focusing lens components are difficult to make and handle, and integrating these into an array structure requires very difficult fixturing and bonding processes. Consequently, micro-lens arrays are typically manufactured as monolithic arrays.

Conventional micro-lens arrays (MLAs) are usually made as a thin plate of transparent amorphous material, such as glass, silicon, borosilicate glass, plastic, or crystal. One or both of the opposite surfaces is shaped, so the surface profile resembles like an array of bulges, wherein each bulge functions as an individual lens, as shown in FIG. 1. Surface profiling is typically performed using lithography tools, or by stamping, molding, casting, or rolling. Commercial MLA plates are typically relatively thick, thereby increasing the size and weight of usually compact FPA designs. The MLA is a separate component of an FPA sensor system that increases parts count. In addition, the MLA typically requires enhanced manufacturing tolerances, and a special alignment process is needed for FPA sensor system assembly. Furthermore, round-shaped lenses do not fit rectangular or hexagonal pixel cells, and multiple reflections between profiled surfaces give cross-coupling between individual lenses in the array.

Hence there is a need in the art for alternative methods of light concentration and other types of micro-lenses for FPA applications.

SUMMARY OF INVENTION

Aspects and embodiments of the present invention are directed generally to electromagnetic sensors. Specifically, various aspects and embodiments are directed to a sensor system including a focal plane array of electromagnetic energy sensors and micro-lenses configured to focus incident electromagnetic energy on the sensors of the focal plane array. In accordance with various aspects and embodiments, there are provided apparatus and methods of fabricating and using an apparatus including micro-lens arrays designed to improve the geometric collecting efficiency of electro-optical detector focal plane arrays wherein the active area of the FPA is smaller than the size of the unit cell area. Micro-lenses disposed above every FPA pixel effectively increase the geometric collection efficiency thereby improving detection sensitivity for both active laser radar (ladar) and passive electro-optic/infrared (EO/IR) receivers.

In accordance with an aspect of the present disclosure there is provided an electromagnetic radiation sensor. The electromagnetic radiation sensor comprises a dielectric substrate including a front surface and a rear surface, an electromagnetic radiation detector element disposed on the rear surface of the substrate, and a lens comprising a three dimensional polaritonic metamaterial structure including a pattern of features formed in the front surface of the substrate, the lens configured to focus electromagnetic radiation incident on the front surface of the substrate onto the electromagnetic radiation detector element.

In some embodiments, a spacing between adjacent features is less than a wavelength of the electromagnetic radiation. In some examples, the spacing between adjacent features may be less than about half of the wavelength of the electromagnetic radiation or less than about one quarter of the wavelength of the electromagnetic radiation.

In some embodiments the pattern of features includes a plurality of one of pillars and holes.

In some embodiments the electromagnetic radiation sensor comprises a plurality of pixels and the electromagnetic radiation detector element and lens are included in a same single pixel of the electromagnetic radiation sensor.

In some embodiments the plurality of lens elements forms a substantially continuous array across the radiation sensor.

In some embodiments the pattern of features forms a layer which is antireflective to at least one frequency of electromagnetic radiation.

In some embodiments each of the features has a substantially constant diameter.

In some embodiments the spacing between adjacent features varies across the lens.

In some embodiments the pattern of features includes one of a barrel distortion and a pin-cushion distortion.

In some embodiments the spacing between adjacent features is substantially constant across the lens.

In some embodiments a diameter of adjacent features varies across the lens.

In some embodiments one of a height and a depth of the features varies across the lens.

In some embodiments the electromagnetic radiation detector element comprises one of a photodiode and a microbolometer.

In accordance with another aspect of the present disclosure there is provided a method of fabricating a pixelated electromagnetic radiation sensor. The method comprises selecting a substrate and fabricating a plurality of pixel elements. Each pixel element includes an electromagnetic radiation detector element on the rear surface of the substrate, and a lens including a pattern of features formed in the front surface of the substrate, the lens configured to focus electromagnetic radiation incident on the front surface of the substrate onto the electromagnetic radiation detector element.

In some embodiments fabricating the plurality of pixel elements comprises fabricating the lens with a spacing between adjacent features of the pattern of features being less than a wavelength of the electromagnetic radiation. The method may also include fabricating the lens with the spacing between adjacent features of the pattern of features being less than about half of the wavelength of the electromagnetic radiation or less than about one quarter of the wavelength of the electromagnetic radiation.

In some embodiments selecting the substrate comprises selecting a substrate substantially transparent to a wavelength of electromagnetic radiation to which the electromagnetic radiation detector element is sensitive.

In some embodiments fabricating the pattern of features comprises forming a plurality of one of pillars and holes in the front surface of the substrate.

In some embodiments the pattern of features is formed by etching the front surface of the substrate.

In some embodiments the pattern of features are formed with substantially constant diameters.

In some embodiments the pattern of features are formed with the spacing between adjacent features varying across the lens.

In some embodiments the pattern of features are formed with the spacing between adjacent features being substantially constant across the lens.

In some embodiments the pattern of features are formed with a diameter of adjacent features which varies across the lens.

In some embodiments the pattern of features are formed with one of a height and a depth of the features which varies across the lens.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
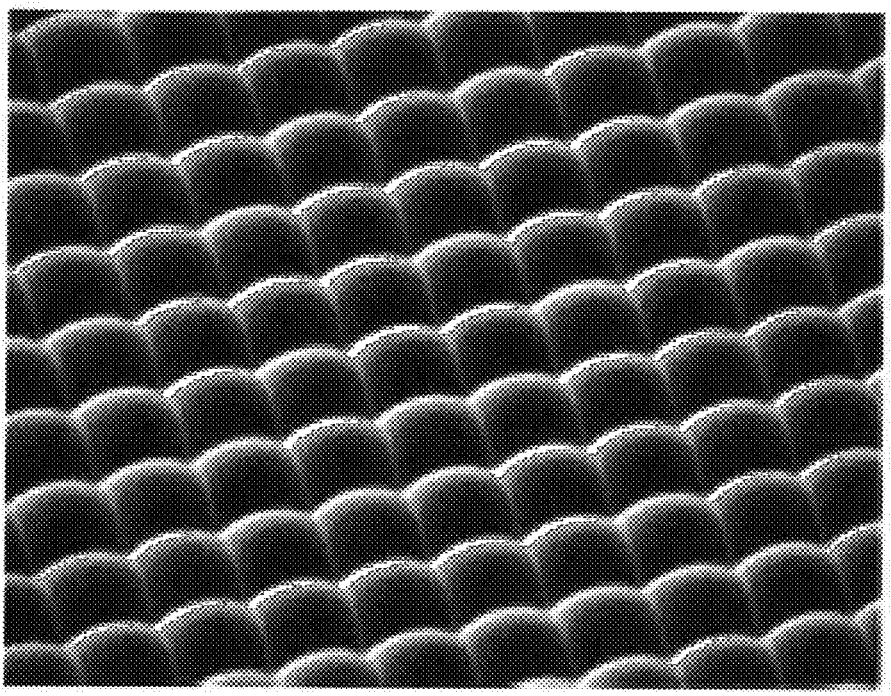
FIG. 1 is an illustration of a surface of a conventional micro lens array.

Aspects and embodiments are generally directed to sensors for the detection of electromagnetic radiation, and in particular, for the detection and/or imaging of optical radiation. In the design of electromagnetic radiation sensors, particularly optical sensors, various design considerations are often taken into account to provide for a sensitive, yet low noise sensor. To reduce the Shot noise associated with leakage current in electro-optical detectors operating in the direct-detection mode, it is advantageous to minimize the active area of the pixel (bulk leakage) and the length of the perimeter surrounding the active area (surface leakage). To reduce the crosstalk between adjacent detector pixels, it is advantageous to widen the gap between these active areas which contain isolation structures, such as diffused p-n junction barriers and etched V-groove structures. However, in optical sensors, such as focal plane array (FPA) sensors, if no mechanism for focusing is used, imaging light would be wasted in the interstitial gaps. Accordingly, it may be advantageous to provide an FPA sensor with lenses disposed above every FPA detector element to increase the geometric collection efficiency and improve detection sensitivity of the sensor. Additionally, a well designed electromagnetic radiation sensor is low cost, lightweight (especially for utilization in aircraft), low-power, and robust with regard to radiation.

Aspects and embodiments of the present invention provide for an electromagnetic radiation sensor, such as an FPA sensor, which employs an array of lenses that are formed by micro-patterning a substrate of the sensors. According to various aspects and embodiments, lenses for FPA sensors are formed from a patterned layer of a dielectric material. The patterned layer is referred to herein as a "metamaterial lens" or "metamaterial micro-lens." These micro-lenses may provide advantages with regard to, for example, size, weight, ruggedness, and cost as compared to conventional lens systems, as discussed further below.

It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Figure 2A:
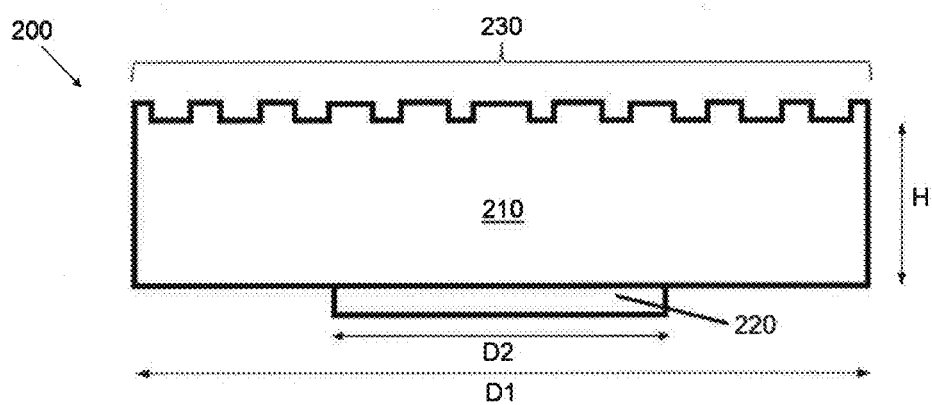
FIG. 2A is a schematic cross-sectional illustration of a portion of an electromagnetic radiation sensor in accordance with aspects of the present invention.
Figure 2B:
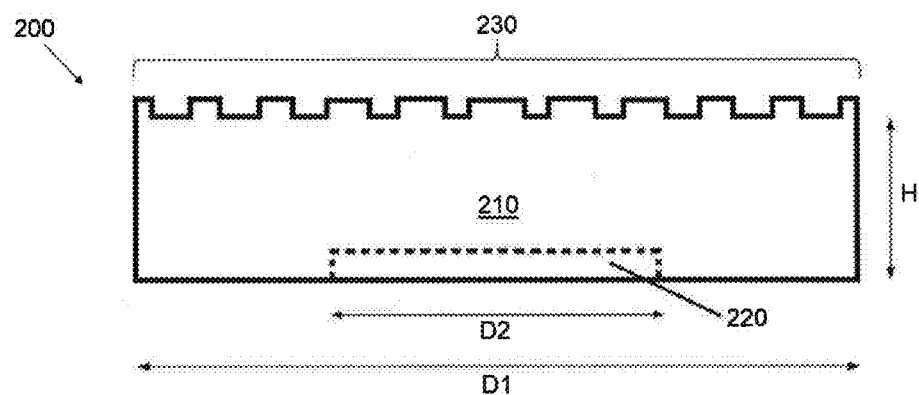
FIG. 2B is a schematic cross-sectional illustration of a portion of an electromagnetic radiation sensor in accordance with aspects of the present invention.

Referring to FIGS. 2A and 2B, there are illustrated in cross section a portion of examples of an electromagnetic radiation sensor, indicated generally at 200, in accordance with certain embodiments. FIGS. 2A and 2B illustrate a single pixel of the electromagnetic radiation sensor. In some embodiments a plurality of pixels, for example several thousand, may be formed together on a common substrate to form a FPA sensor system. For example, in some embodiments an FPA sensor system may include a 1040 by 720 array of pixels. The electromagnetic radiation sensor 200 includes a substrate 210 which has a characteristic pixel width D1, which is in some embodiments, for example, between about 5 micrometers (μm) and about 60 μm, and a height H which may be, for example, about 0.5 millimeters (mm). An electromagnetic radiation detector element 220 is disposed on a rear surface of the substrate (FIG. 2A) or embedded in the substrate (FIG. 2B). The electromagnetic radiation detector element 220 has a width D2 which is smaller than the pixel width D1. D2 is in some embodiments, for example, about 0.25 times D1, 0.33 times D1, or 0.5 times D1, although embodiments are not limited to any particular ratio between D1 and D2.

Embodiments of the electromagnetic radiation sensor 200 may be used to detect a specific wavelength or band of electromagnetic radiation, for example, infrared light, and/or image an object using this specific wavelength or band of electromagnetic radiation. As discussed above, according to certain embodiments, the FPA sensor 200 includes an array of micro-lenses formed through the use of a patterned dielectric layer and configured to focus incident electromagnetic radiation in the wavelength range, or waveband, of interest. Accordingly, the electromagnetic radiation sensor 200 further includes a patterned area of features, referred to herein as a focusing phase mask 230, which may include, for example, pillars or holes or other features, formed on or in a front side of the substrate 210. As incident electromagnetic radiation passes through the phase mask 230, it is focused onto the electromagnetic radiation detector element 220. The electromagnetic radiation detector element 220 produces a signal responsive to being exposed to the specific wavelength or band of electromagnetic radiation of interest, and an image may be constructed from the signals from the one or more electromagnetic radiation detector elements in the electromagnetic radiation sensor.

It may be desirable that the metamaterial micro-lenses formed by the phase mask 230 are thin and have strong focusing power. There are several challenges associated with achieving these design goals. For example, the thickness of the focusing phase mask 230 may be on the order of approximately one wavelength (in the wavelength range of interest), as discussed further below. It may be preferable that the focusing phase mask 230 has sufficient focusing power to effect an optical path difference (OPD or $\Delta\phi$) that is greater than $\pi/2$ radians. Significant spatial modulation of the effective refractive index inside the layer providing the phase mask 230 is therefore desirable to achieve this focusing power. Simultaneously, the phase mask 230 is desirably transparent to the electromagnetic radiation, for example, infrared optical radiation, which the electromagnetic radiation detector element 220 is intended to detect. The improvement in geometric collecting efficiency achieved by directing nearly all the photons over the pixel to the smaller sized active area is desirably not compromised by the loss of photons due to absorption within the metamaterial layer. In addition, it is desirable that the Fresnel reflections associated with the micro-lens structure be substantially suppressed to further minimize the insertion loss.

While these desirable features may appear mutually contradictive, aspects and embodiments of a design of the metamaterial layer disclosed herein are capable of achieving performance desired for use in many FPA array sensors. As discussed above, various aspects and embodiments use dielectric metamaterial layers to produce the micro-lenses instead of plasmonic or split-ring resonator (SRR) metamaterials. In some embodiments all material components of the focusing layer are of a dielectric nature, with a reasonably low loss tangent $\delta$, for example, with $\delta$ less than about 0.1. This helps to minimize, or even fully eliminate, dissipation effects inside the layer. However, some thin metallic features may be added to the purely dielectric pattern, for example, to better control dispersion properties of the layer, but without significantly increasing insertion loss.

Figure 3:
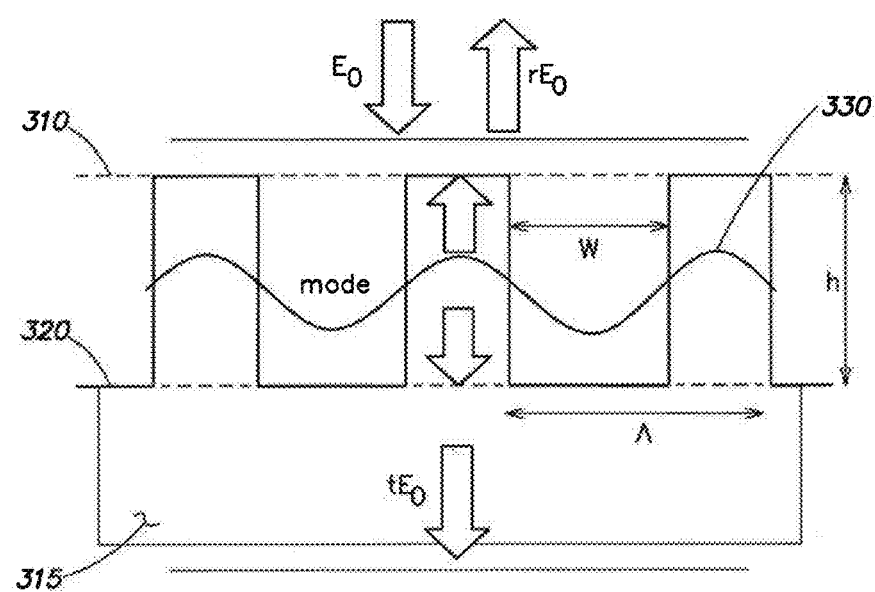
FIG. 3 is a schematic cross section of a surface pattern in a dielectric metamaterial layer.

An example of a simple stripe dielectric surface depth pattern is shown schematically in FIG. 3. This cross section of the pattern includes parallel rectangular grooves oriented perpendicular to the plane of the figure. The groove width is denoted as w, and the local period of the pattern is $\Lambda$. In some examples, both are much smaller than the wavelength, $\lambda$, of incident radiation, (w, $\Lambda$)<<$\lambda$, for example, about 0.25 times the wavelength, $\lambda$, of the incident radiation or less. The grooves may be periodically spaced, or variably spaced as shown in FIGS. 2A and 2B. In one example, the average center-to-center spacing of the grooves or features in phase mask 230 may be about 0.2 times the wavelength of the electromagnetic radiation that the electromagnetic radiation sensor 200 is intended to detect. The average center-to-center spacing of the features in the phase mask 230 may be, for example, about 0.3 μm for infrared applications in the 1.5 μm eyesafe wavelength band. The groove depth can be deeper, for example, comparable to the wavelength, $h=\lambda$ as discussed above, to increase strength of the phase mask 230. The center-to-center spacing and/or depth or height of the grooves/features may vary, for example, radially, across the width of the pixel, as discussed further below. The pattern of parallel groves represents an anisotropic structure giving different characteristics along and across the grooves. The layer of modified material, which serves as the dielectric metamaterial layer in this case, is located between the first interface 310 and the second interface 320 in FIG. 3. The bulk of the dielectric 315 with refractive index, $n_d$, is below the second interface 320 and corresponds to the substrate 210, while the air, with index $n_{air}=1$, is above the first interface 310.

Figure 4:
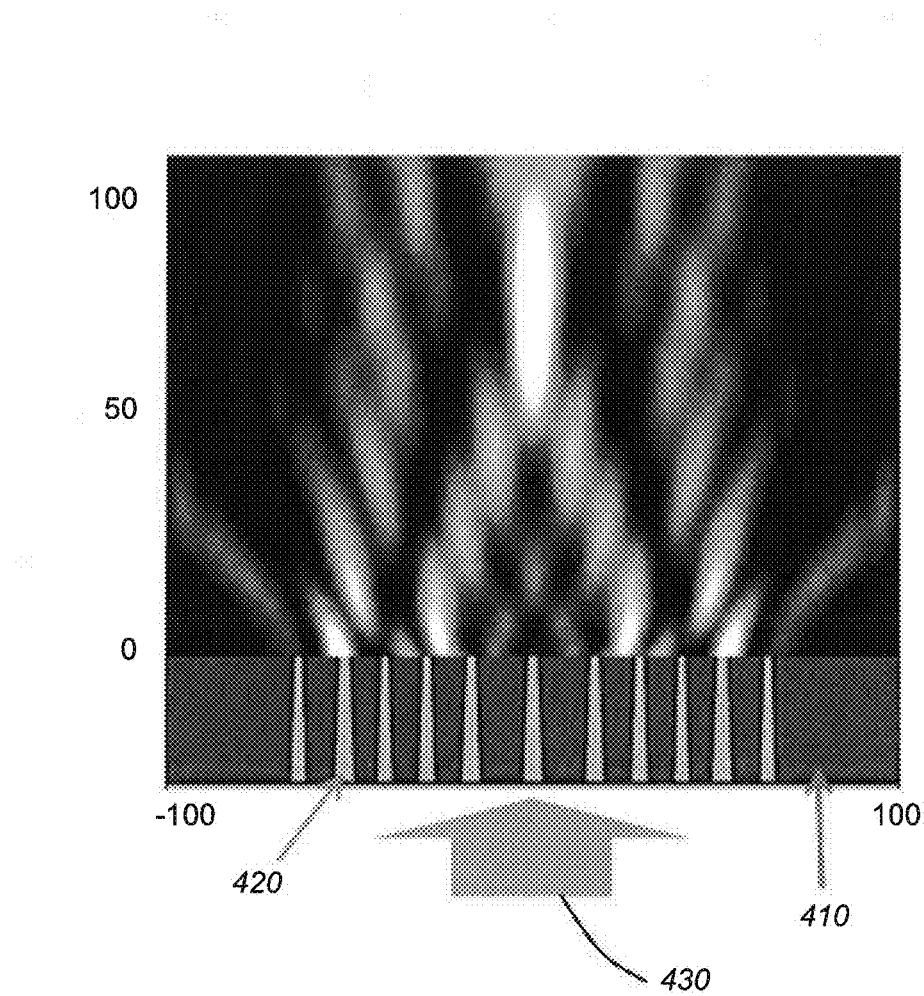
FIG. 4 is an illustration of a light intensity pattern for light passing through a micro-lens in accordance with aspects of the present invention.

A groove pattern, similar to the one shown in FIGS. 2A, 2B, and 3, can be applied for making cylindrical micro-lenses, as illustrated in FIG. 4. In one example, a simulation was performed on a simulated 200 μm wide by 23.3 μm thick layer of crystalline silicon carbide (SiC) 410, having polymer-filled grooves 420, filled with a polymer having a refractive index of 1.5, with gradually varying width and spacing from the middle of the lens to the side, demonstrated a relatively strong focusing effect, with about 75 μm focal depth, for 12.35 μm radiation 430. Lens transmission integrated over the cylindrical lens area was calculated to be 62%, with an intensity enhancement factor at the focus of about 2.63, if normalized at incident beam intensity. Similar cylindrical micro-lenses may be made using a different dielectric material, a different fine pattern over the lens, for a different wavelength, with different shapes of grooves, with different filler, or without any filler.

In the structure illustrated in FIG. 3 the modified layer between the first and second interfaces 310, 320 is a "mix" of high-index dielectric 315 (having an index of refraction $n_d$) with low index air. As a result, the layer is partially filled by the optically dense dielectric 315. According to one embodiment, since all the structural features are sub-wavelength in size, an effective refractive index of the modified layer, $n_{eff}$, may be introduced. Its value lies between the indices of contributing materials, $1 < n_{eff} < n_d$. It is this, the lateral gradient in this effective index resulting from lateral changes in these structural features that is responsible for the focusing power of the micro-lens, similar to a GRIN microlens.

Radiation that crosses the metamaterial layer of the periodic, sub-wavelength grating shown in FIG. 3 forms discrete propagation modes. When $\Lambda \ll \lambda$, only one fundamental mode propagates through the pattern having a real value for the effective index. Higher order modes have light intensity features smaller than the metamaterial features. The higher order modes have complex value effective indices, such that the intensity decays with depth exponentially, as it does for evanescent waves. Therefore, such higher order modes cannot propagate deeply into the layer, resulting in poor optical transmission for light carried by these modes. The effective index for the fundamental mode can be determined as a function of the volume fill factor, $\rho$, defined herein as the portion of the layer volume occupied by the dielectric 315. The fill factor is $\rho = w/\Lambda$ for the parallel-stripe structure of FIG. 3.

Figure 5:
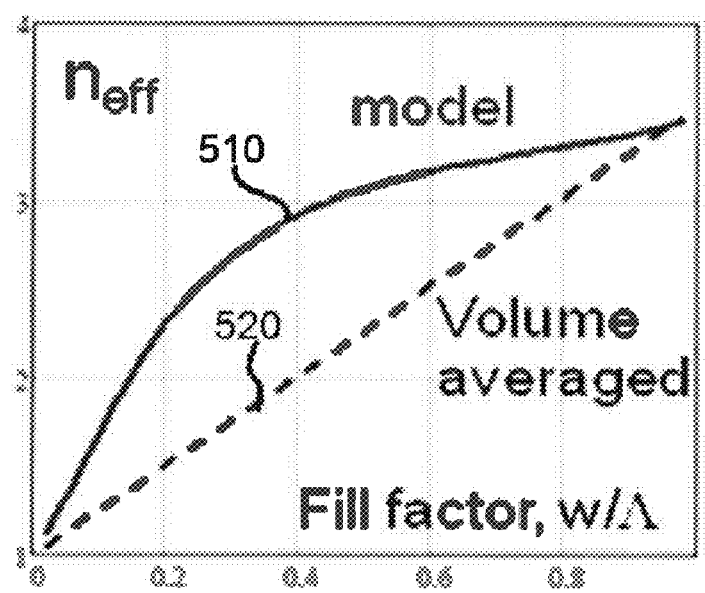
FIG. 5 is a graph illustrating an effective refractive index for a lowest order mode propagating across the dielectric metamaterial layer of FIG. 3 vs. fill factor.

This dependence, $n_{eff}(\rho)$, is plotted in FIG. 5 (trace 510) for a particular example of $\lambda \approx 1.55$ μm, silicon as the basic dielectric, $n_d \approx 3.5$, and a groove spacing of $\Lambda = 300$ nm. For comparison, a volume-averaged index, $[(1-\rho)+n_d\rho]$, is also plotted as a dotted straight line 520. There is a difference between the mode index $n_{eff}$ and the volume averaged index. This difference originates from the specifics of mode formation. Propagating light tends to be concentrated within the high-index portion of the layer, while minima of mode intensity are located in the air grooves between the dielectric bars, as schematically shown in FIG. 3 by a wavy line 330. Light concentrated within the dielectric typically results in a higher value of effective index compared to the volume averaged value. The effective mode index, $n_{eff}$, becomes more sensitive to small changes in the fill factor, $\rho$, for low values of the fill factor. For small fill factors, for example, $\rho$ less than about 0.3, changing the fill factor by about 10% results in an increase of the mode effective index from 1 to nearly 2, $\Delta n \approx 1$. The light concentration effect becomes more pronounced at small $\rho$.

Nonlinear dependence of the effective parameters of the fine patterned layer, refractive index in this case, on the fill factor is a feature of many metamaterials. Effective electromagnetic characteristics in metamaterials, such as permittivity, permeability, refractive index, and impedance, for example, may deviate from values estimated via simple volume-weighted averaging rules.

FIG. 3 also illustrates the origin of interference effects inside the fine patterned dielectric layer/phase mask 230. These interference effects should be considered in the design of a micro-lens to ensure proper control of phase mask amplitude on transmission, as well as for reducing surface reflections. The first and second interfaces 310, 320 specified in FIG. 3 can be considered as two parallel surfaces of a thin Fabry-Perot (FP) interferometer with the metamaterial layer located in between. The interferometer thickness is the surface etching depth, h. Incident light within the layer can experience multiple reflections at the interfaces resulting in both transmission and reflection characteristics which depend on the wavelength, layer thickness, and the fine structure in the layer.

The performance of the structure illustrated in FIG. 3, however, differs from that of a standard FP interferometer. In particular, both interfaces 310, 320 are not continuous, but are in fact "perforated" surfaces including dielectric/air boundary patches separated by non-reflecting openings, with the same material on both sides. Since the dimensions of those patches are sub-wavelength, an effective reflectivity of the entire interface can be determined, similar to the effective index of the metamaterial layer. Simple averaging over the entire surface can be done, assuming Fresnel reflectivity within the patches where a dielectric/air surface exists, and using zero reflection with 100% transmission for areas in between the patches. Hence, the effective reflectivity for both interfaces is smaller than the Fresnel reflectivity of just the bare surface of the dielectric.

Additionally, radiation in the air above the layer, and also in the bulk of dielectric 315 below the layer, propagates and diffracts as in optically homogeneous media. For normal incidence at the layer, the corresponding transmitted and reflected waves are vertically propagating plane waves. Inside the layer, however, light is represented by the modes of the layer. Due to the dissimilarity between the plane waves outside the layer and the fundamental mode that can propagate between reflecting interfaces, proper modeling desirably utilizes a field-projection operator every time light crosses an interface. When crossing the interface, the plane wave acquires a lateral amplitude modulation. Transmissivity through the air/dielectric interface differs from the pure unity coefficient at an air/air boundary in the space between the reflecting patches. This amplitude modulated field pattern may be projected on the fundamental mode field pattern. A similar sequence of operations may be performed when the fundamental mode is radiated out from the layer and reflected backward into the layer. For conditions of interest, for example, where $\Lambda \ll \lambda$, the fundamental mode is the one that is most highly excited at normal incidence. This is because the phasefront of the fundamental mode is flat, as it is for a plane wave, and also because the amplitude modulation is relatively moderate.

However, some portion of the incident light will excite higher-order modes of the layer. Since those modes are analogues to evanescent waves attenuated inside the layer, this portion corresponds to a scattering loss, which can also reduce transmissivity at each of the interfaces.

Figure 6:
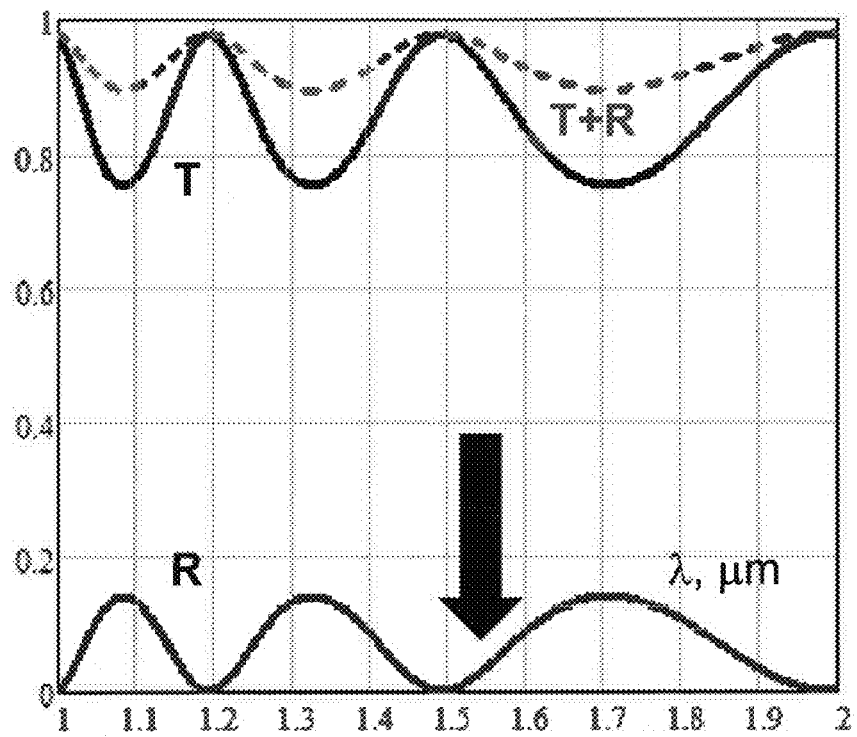
FIG. 6 is an illustration of wavelength dependency for reflectivity and transmissivity for the dielectric metamaterial layer of FIG. 3.

As a result of the low reflectivity at the "perforated" interfaces, the corresponding FP interferometer exhibits a low Q-factor. Correspondingly, the contrast of the interference modulation created by this interferometer becomes low as well. FIG. 6, where T indicates the percentage radiation transmitted and R the percentage radiation reflected, illustrates the modeled performance of the patterned surface of FIG. 3 for a silicon metamaterial layer with $\Lambda = h = 350$ nm and $w = 210$ nm. Spectral fringes typical of a FP interferometer are present. These fringes are broadly separated, since the interferometer base is very thin. The fringe contrast is relatively low. The sum of reflectivity and transmissivity is not always equal to 100%, due to the minor scattering loss generated by non-propagating higher-order modes. The reflectivity can be reduced to practically zero when reflections from two interfaces are accurately anti-phased and the reflectivity for both interfaces is almost the same. For these conditions, the transmission through the layer will be close to 100%.

According to one embodiment, the performance of the metamaterial layer may be controlled through characteristics of the fine pattern of the layer. Interferometer fringe positions depend on the depth of etching, which serves here as a spacer between the FP reflecting surfaces. Such dependence is common for any FP interferometer. According to certain aspects, the fill factor, $\rho$, as well as the shapes and relative positioning of the fine pattern features, may also be used to "tune" the interferometer because these parameters all affect the effective refractive index of the material between the reflectors and, hence, the optical path length between the interfaces. In addition, these parameters also affect the effective reflectivity of the interfaces and, hence, the contrast of the interference fringes. This control provides a powerful tool for optimizing the performance of the metamaterial interferometer via proper design of the fine pattern.

In one embodiment, the dielectric metamaterial layers may additionally provide an anti-reflection (AR) function. Further, since in some embodiments transmitted radiation passes through the same layer multiple times, the optical phase delay becomes stronger compared with a single-pass through the same layer. Both of these effects, namely reduced insertion loss due to the antireflective property and enhanced amplitude of the phase mask 230 on transmission, may be utilized in the design of embodiments of the micro-lens.

The fine patterning method for achieving anti-reflection provides certain benefits compared to conventional approaches to forming an AR coating, for example, where one or more layers of different materials are deposited on the surface at a prescribed thickness. Various embodiments of the sub-wavelength depth-patterned AR surfaces disclosed herein are mechanically robust. Various embodiments are robust with regard to thermal cycling and intense irradiation. In some embodiments of the fine patterned AR layer there are no interfaces between dissimilar coating materials, since only one dielectric material is used and the only interface is with air. This eliminates typical problems of conventional AR coatings such as poor adhesion, delamination due to mismatch in coefficient of thermal expansion, and bond-strength sensitivity to irradiation. In some embodiments, very little light is absorbed in the transparent dielectric metamaterial layer. As a result, these embodiments are less sensitive to self-heating in high power laser applications. Furthermore, in some embodiments, the metamaterial surface is capable of achieving the AR effect within broad spectral bands. Due to the low Q-factor of the interferometer, the AR bandwidth is given by half of the FP free spectral range. Since the dielectric metamaterial layer is in some embodiments very thin and made of fine sub-wavelength elements, the AR property is achieved over broad angles of incidence as well.

The low reflectivity of the two interfaces bordering the metamaterial layer is responsible for the low spectral fringe contrast in the interference pattern, as shown in FIG. 4. The fringe contrast can be enhanced through a variety of surface designs, to the point that the reflection/transmission spectra show narrow isolated peaks. Higher fringe contrast can result from a higher Q-factor for the effective interferometer, due to efficient light trapping between the interfaces. In one such exemplary design, a thin dielectric layer may be added as a buffer under the groove pattern. In this example the second interface 320 becomes reflecting even under the dielectric stripes due to an index difference with the buffer. This can be achieved using, for example, silicon on silica wafers, with the silica serving as the buffer and with the silicon layer etched down to the buffer layer to produce the fine pattern.

In some embodiments, the patterns of features forming the dielectric metamaterial layer belong to wider class of depth-profiled dielectric surfaces than discussed above. In some examples, as discussed above, surface depth may be the only property that is patterned, and no other features or materials are added. Individual elements of the fine patterns may all be axially symmetric, and their positioning over the surface may be purely periodic in certain examples. However, in other examples, various other parameters of aspects of the microlenses may additionally or alternatively be modulated to provide a desired performance.

Figure 7A:
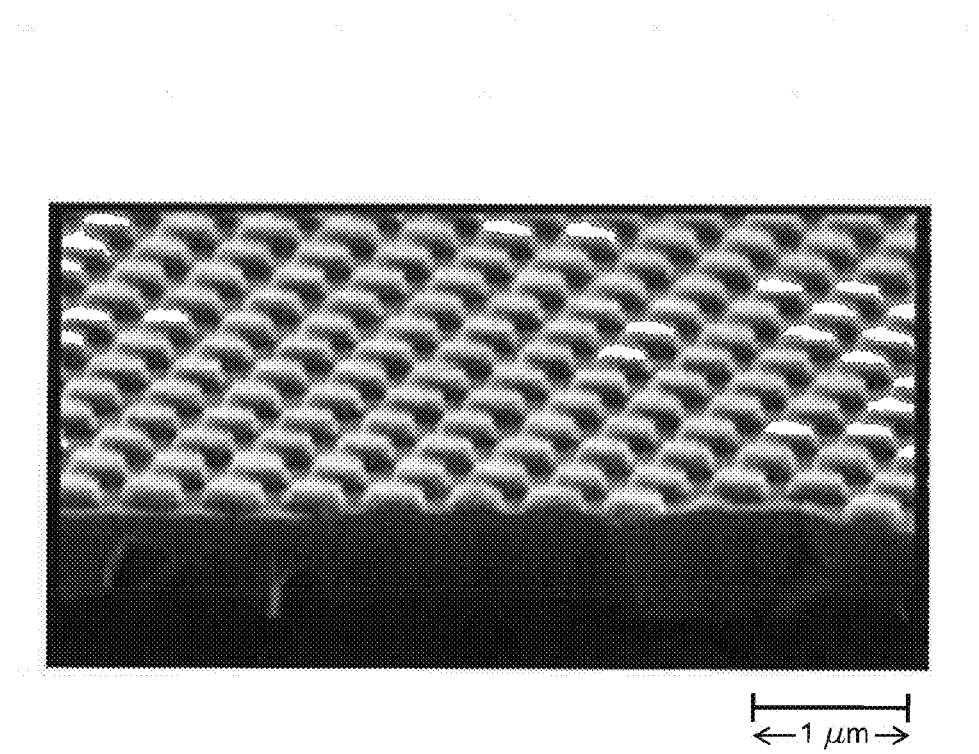
FIG. 7A is a scanning electron microscope (SEM) image of an array of round pillars formed in a substrate in accordance with aspects of the present invention.
Figure 7B:
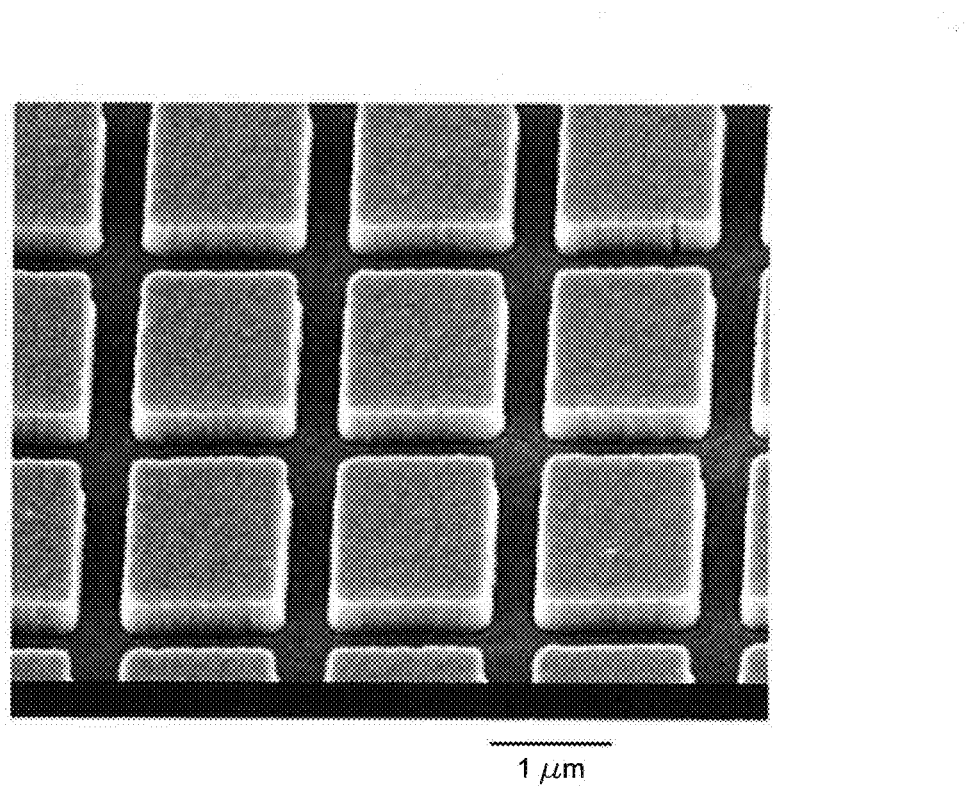
FIG. 7B is a SEM image of an array of substantially square pillars formed in a substrate in accordance with aspects of the present invention.
Figure 7C:
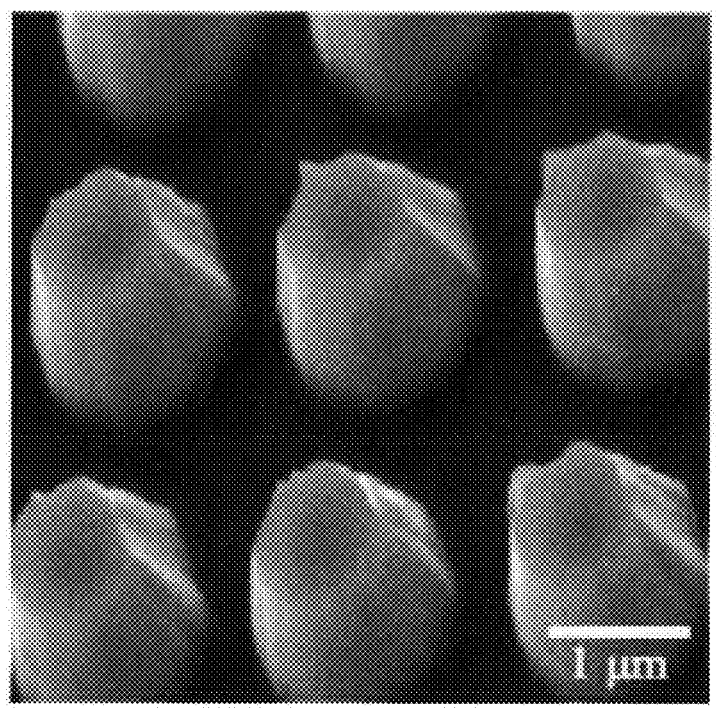
FIG. 7C is a SEM image of an array of tapered pillars formed in a substrate in accordance with aspects of the present invention.
Figure 8A:
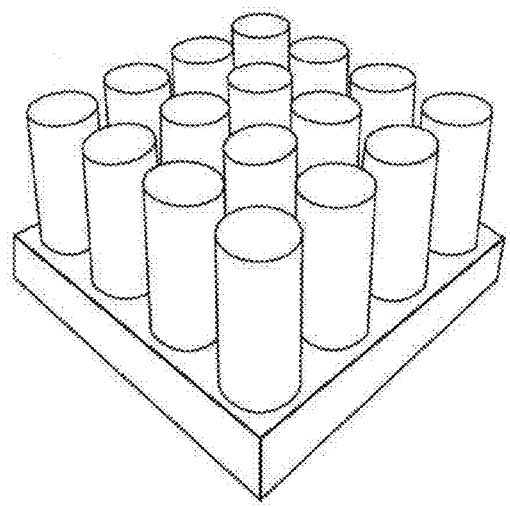
FIG. 8A is an isometric view of a portion of periodic rectangular pattern of pillars formed in a substrate in accordance with aspects of the present invention.
Figure 8B:
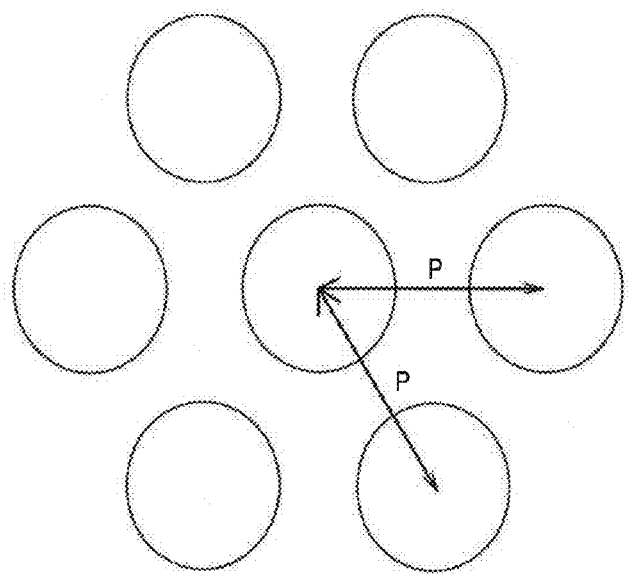
FIG. 8B is a plan view of a periodic hexagonal pattern of pillars.
Figure 9A:
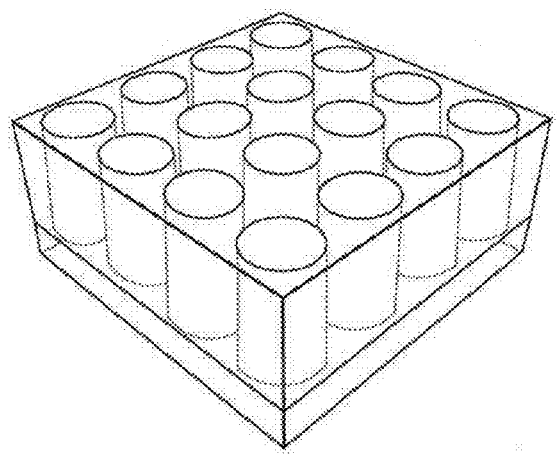
FIG. 9A is an isometric view of a portion of periodic rectangular pattern of holes formed in a substrate in accordance with aspects of the present invention.
Figure 9B:
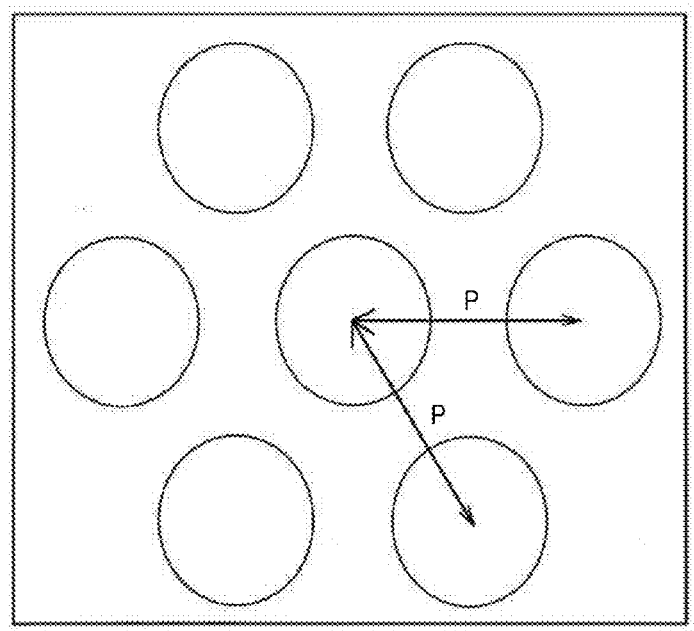
FIG. 9B is a plan view of a periodic hexagonal pattern of holes.

According to other embodiments, a variety of geometric shapes for individual elements of the 2-D patterns of the phase mask 230 may be used. These shapes may include round pillars, as shown, for example, in FIG. 7A, or round holes etched into a flat dielectric, for example. Instead of being round, the elements may be square, as in FIG. 7B, hexagonal, or of any other shape that, in some embodiments, is symmetric about a surface normal axis. The etched sidewalls of the element need not be vertical, and instead may be tapered as cone segments, as shown in FIG. 7C, for example. To add polarization sensitivity, the elements may be made anisotropic, for example, rectangular or elliptical. As will be appreciated by those skilled in the art, given the benefit of this disclosure, alternative shapes provide advantages for different applications, and the various embodiments discussed herein are not limited to any particular shape or arrangement of the features of the phase mask 230.

Relative positioning of the pattern elements may also be important in the design of a dielectric metamaterial microlens. As discussed above, the pattern can be made spatially periodic, such as the patterns shown in FIGS. 8A, 8B, 9A, and 9B, for example. However, this periodicity is in some embodiments local across a meso-scale region which is much smaller than the lens pixel size, but still much larger than the pattern element size. The pattern of interest is in some embodiments quasi-periodic, with gradually varying pattern characteristics from the lens center to its periphery. The characteristics for slow variation in radial directions can be in the three-dimensional shape and dimensions of the pattern elements, local period, etching depth, or combinations thereof.

In other embodiments, the shape of the elements forming the phase mask 230 may vary across the pattern, and the pattern itself may be irregular (or even random), or both. FIGS. 10-13 illustrate various arrangements for micro-lens patterns that will produce phase mask characteristics useful for some FPA micro-lens arrays. These figures all are schematic and not to scale, and are presented to illustrate certain examples not intended to be limiting. Embodiments of the micro-lens design are not limited to these examples, or to patterns which exhibit square and hexagonal symmetry; many other approaches may be utilized as well.

Figure 10:
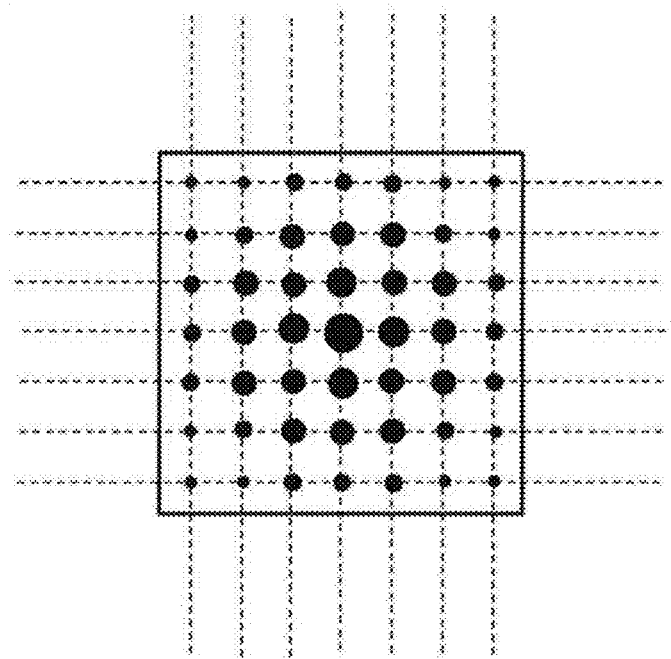
FIG. 10 is a schematic illustration of a micro-lens structure based on radius variations for equidistant pillars arranged in square symmetry.
Figure 11:
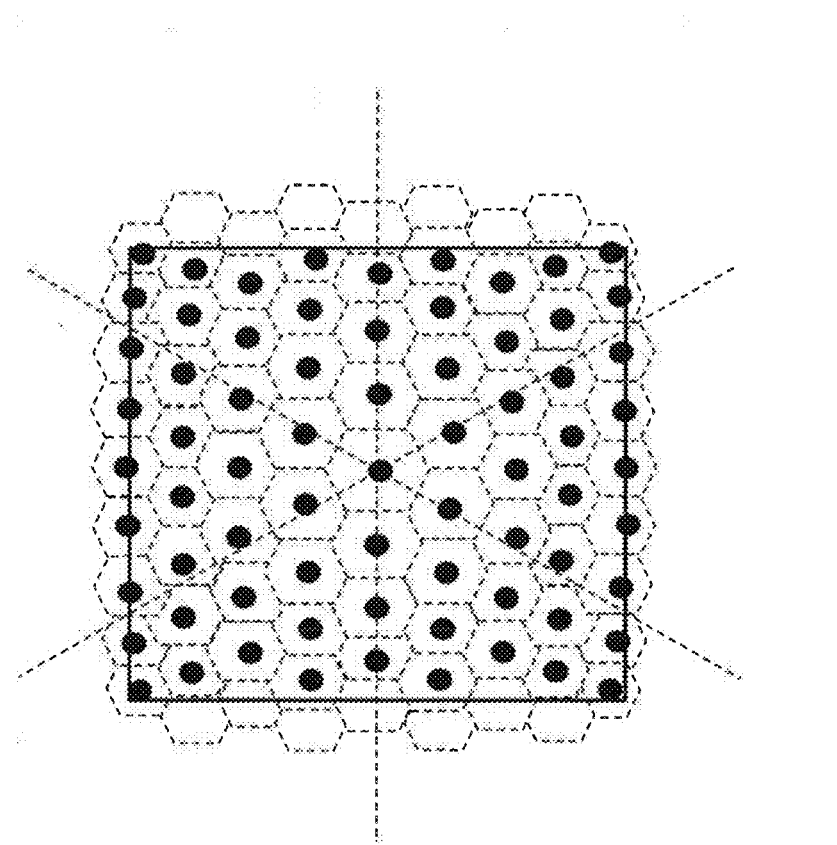
FIG. 11 is a schematic illustration of a micro-lens structure based on spacing variations between identical holes in quasi-hexagonal symmetry.
Figure 12:
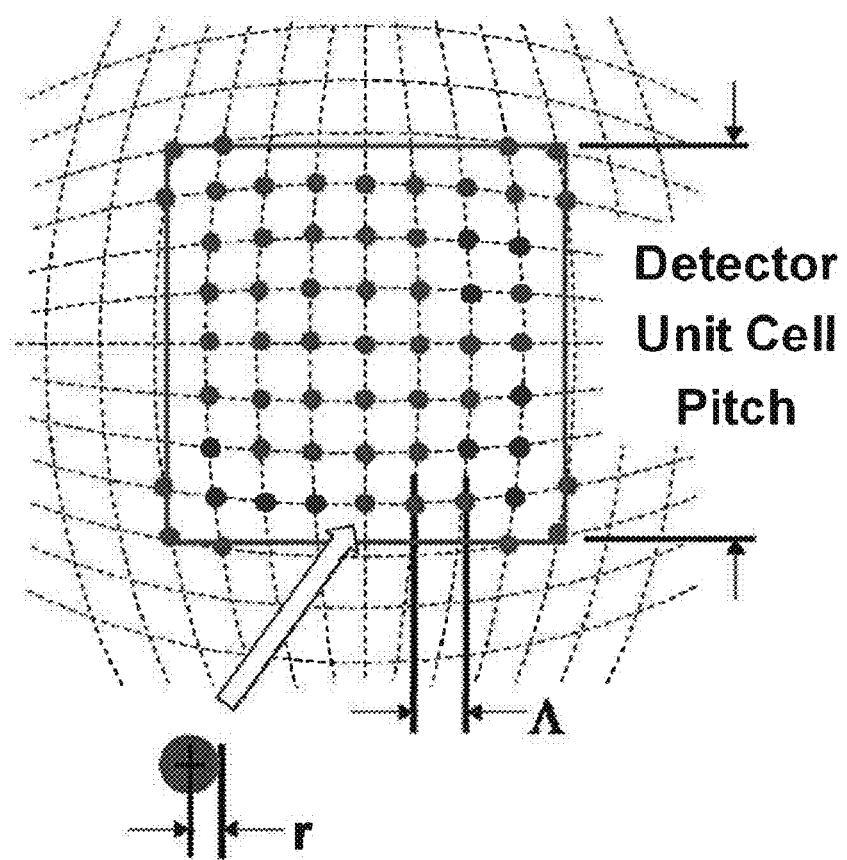
FIG. 12 is a schematic illustration of a micro-lens structure based on spacing variations between identical holes in quasi-square symmetry illustrating barrel distortion.

In FIG. 10, a pillar or hole pattern is arranged in a square-shaped regular array with equal spatial periods in both orthogonal directions. Fill factor, $\rho$, variations may be created by a gradual reduction in pillar/hole diameter from the lens center to its periphery, thereby reducing the volume fraction of the dielectric in the layer. Another approach is illustrated in FIG. 11 for a pattern of identical pillars/holes in hexagonal symmetry. In one example, an increased fill factor near the center of the array is created by "stretching" the hexagonal array of pillars/holes near the center to reduce the volume fraction of air in this region. This produces a "barrel" distortion of the array resulting in a positive or focusing lens. In FIG. 12, the barrel distortion stretch is applied to a square-symmetry array of identical pillars/holes with the same result.

Figure 13:
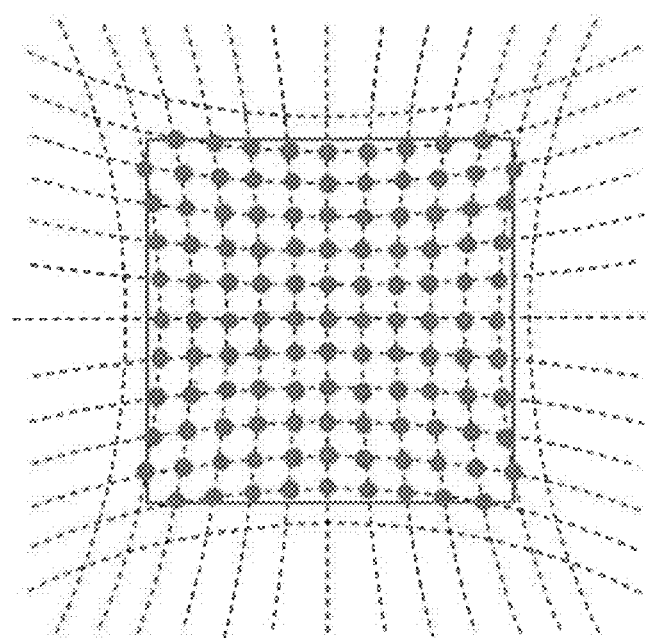
FIG. 13 is a schematic illustration of a micro-lens structure based on spacing variations between identical holes in quasi-square symmetry illustrating pin cushion distortion.

In FIG. 13, the square-symmetry array is stretched at the corners corresponding to a pin-cushion distortion, resulting in a lower volume fraction of air near the edges to create a negative or diverging lens.

Some embodiments of the micro-lens array include a quasi-periodic rectangular pattern of holes, for example, round holes. Design parameters of hole radius, r, spacing, Λ, between hole centers, and etching depth, h may be selected to achieve the desired micro-lens design performance. Other embodiments of the micro-lens array include a quasi-periodic rectangular pattern of pillars, for example, round pillars. Design parameters of pillar radius, r, spacing, Λ, between pillar centers, and pillar height, h may be selected to achieve the desired micro-lens design performance.

Figure 14:
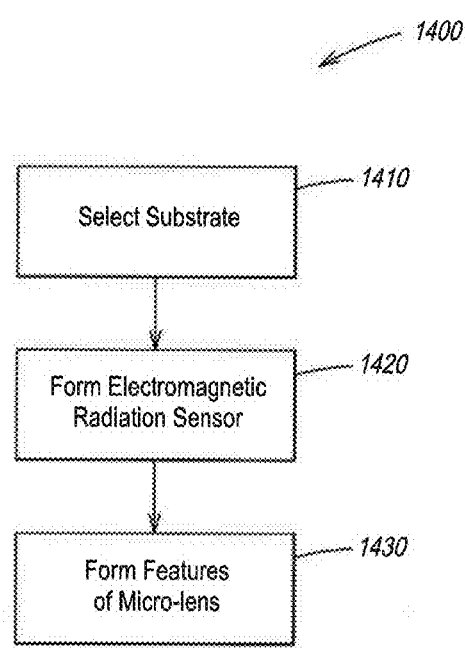
FIG. 14 is a flowchart of a method in accordance with aspects of the present invention.

Electromagnetic radiation sensor systems, for example, FPA sensors including embodiments of a dielectric metamaterial micro-lens as disclosed herein may be fabricated using well-known semiconductor fabrication techniques. An example of such a method is illustrated in the flowchart of FIG. 14, indicated generally at 1400. In a first act 1410, a substrate 210 (FIGS. 2A and 2B) is selected upon which the sensor system will be built. The substrate may be selected based upon the frequency of electromagnetic radiation which the sensor is intended to detect. It is in some embodiments desirable that the substrate be substantially or completely transparent to the frequency of electromagnetic radiation of interest. For example, if the sensor system is intended to detect electromagnetic radiation in the infrared band a silicon, silicon carbide, or germanium substrate may be selected. Other materials could also be selected for the substrate, for example, glass, sapphire, Group III-V semiconductors, Group II-VI semiconductors, or other materials. Embodiments of the present invention are not limited to any particular substrate material.

In act 1420 an electromagnetic radiation detector element 220 (FIGS. 2A and 2B) is fabricated on a surface of the substrate. The electromagnetic radiation detector element 220 in some embodiments comprises a photodiode, in other embodiments comprises a microbolometer, and in some embodiments, may comprise a combination of different types of detector elements. The surface of the substrate upon which the electromagnetic radiation detector element is formed will be referred to herein as the rear surface of the substrate because as will be explained in further detail below, in use, electromagnetic radiation will typically enter the electromagnetic radiation sensor system from the surface of the substrate opposite to that including the electromagnetic radiation detector element.

In some embodiments, the electromagnetic radiation sensor system may include an array of electromagnetic detector elements, and thus, act 1420 may include fabricating a plurality of electromagnetic radiation detector elements on the rear surface of the substrate. In some embodiments, the electromagnetic radiation sensor system is pixilated, and a single electromagnetic radiation detector element is fabricated in each pixel. In some embodiments, each electromagnetic radiation detector element has an area less than that of its corresponding pixel.

As discussed above, the electromagnetic radiation detector element(s) may be formed on a surface of the substrate (FIG. 2A) or embedded in the substrate (FIG. 2B). The design and fabrication of electromagnetic radiation detector elements is known and will not be discussed in detail herein. Act 1420 also, in some embodiments, includes fabricating various interconnects, logic elements, and other features of the electromagnetic radiation sensor system.

In act 1430 a pattern of features forming the phase mask 230 (FIGS. 2A and 2B) is formed on the surface of the substrate (the front surface of the substrate) opposite to that on which the electromagnetic detector elements are formed. The pattern of features may include pillars and/or holes and may be formed in a pattern as described in any of the various embodiments disclosed herein. The pattern of features forms a micro-lens which in various embodiments is designed to focus incident electromagnetic radiation onto the electromagnetic radiation detector elements. A single micro-lens including a plurality of features, for example, pillars or holes, in a pattern of features is, in some embodiments, provided for each pixel of the sensor.

In some embodiments, both the electromagnetic radiation detector elements 220 and the pattern of features making up the phase mask 230 are formed on or in the same substrate material, for example, on or in the same semiconductor or dielectric wafer. In other embodiments, one of the radiation detector elements and the pattern of features are formed on a semiconductor or dielectric wafer, and an epitaxial layer of material, which may be the same material as the semiconductor or dielectric wafer, or another material, is grown or deposited on the semiconductor or dielectric wafer. The other one of the radiation detector elements and the pattern of features is formed on or in the epitaxial layer of material.

In other embodiments, the radiation detector elements 220 and the pattern of features making up the phase mask 230 are formed on different substrates, for example, semiconductor or dielectric wafers, which are subsequently bonded. The different substrates are in some embodiments formed from the same or similar materials, and in other embodiments from dissimilar materials. The different substrates including the radiation detector elements and the pattern of features may be bonded, for example, on their rear sides, by, for example, diffusion bonding, anodic bonding, or other methods of semiconductor or dielectric substrate bonding known in the art.

The etching depth for the fine structure patterning is in some methods controlled by exposure to an etching agent (exposure time to plasma for dry etching or to an acid for wet etching). This exposure time can be difficult to control as a function of position across the pattern to achieve a variable etch depth. For this reason, in some embodiments etching depth may be constant over the entire lens surface. Hence, the radius and spacing of the holes or pillars may be the preferable design parameters that may be varied from the lens center to its periphery.

Etching depth for round holes depends, for the same exposure time, on the radius of the hole. Hence, if the hole depth is to be made constant for every hole in the pattern, the radius of the holes may be constant over the entire pattern. Thus, for some embodiments of a micro-lens design including a quasi-periodic rectangular pattern of round holes the fill factor is varied by changing only the spacing between the holes. A disadvantage of this approach is that the rectangular symmetry of the hole pattern may be distorted near the edges. A barrel distortion, wherein the grid lines of the rectangular pattern are bowed around the center, will yield a positive focus lens (converging rays). A pin cushion distortion, wherein the grid lines are bowed toward the center, will yield a negative lens (diverging rays). These continuous distortions, however, are in some embodiments limited, and more radical features such as edge dislocations, wherein a grid line is terminated within the pattern, may be introduced to achieve stronger focusing characteristics. Such distortions of the periodic pattern may, however, have adverse effects on the electromagnetic performance of the metamaterial layer.

Arrays of features arranged in a hexagonal symmetry can be modified by local stretching or contracting in the radial direction only to reduce the boundary effects mentioned above. This design approach may be most applicable for FPA arrays with a hexagonal pattern of pixels.

Simulation Examples and Results

The discrete modes formalism discussed above with reference to the two-dimensional array of parallel stripes illustrated in FIG. 3 may be applied to three-dimensional structures for describing how radiation crosses the dielectric metamaterial layer. The fundamental mode, which is the only mode passing through the structure depth for $\Lambda<<\lambda$, becomes a two-dimensional function of lateral coordinates. The characteristics of light propagation through the fine patterned layer hold for the three-dimensional case as well. The light associated with the fundamental mode becomes concentrated inside the dielectric portions of the layer. The effective index of the mode increases gradually, but nonlinearly, with increasing three-dimensional layer fill factor. Interference also occurs for the three-dimensional surface metamaterial patterns, resulting in phase mask amplitude enhancement due to the mode multi-passing the layer, and also in anti-reflection properties of the layer.

In the following examples, a high frequency structural simulator (HFSS) software package was applied for rigorous analysis of periodic arrays with different element shapes and arrangements. The software was also used to optimize parameters of micro-lens array designs, as discussed below.

For the following simulations, an example of a micro-lens was used including a rectangular array of round pillars with 300 nm spacing in both lateral dimensions on a silicon surface for 1.55 μm radiation normally incident on the layer. The process for this example was parameterized by varying the pillar radius from 20 nm to 140 nm for different etching depths. Another example of a micro-lens array including a rectangular array of round holes with the same periodicities, as discussed further below. The results are presented in FIGS. 15-18D, and discussed further below.

Figure 15:
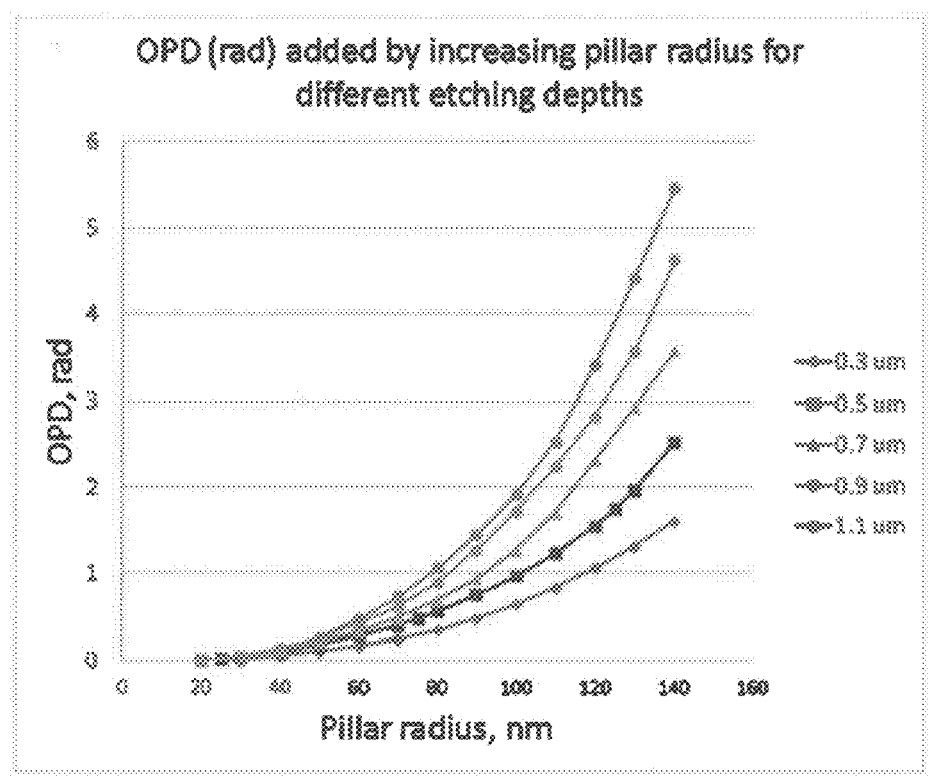
FIG. 15 is a chart of optical path difference (OPD) of transmitted light for rectangular symmetry pillar patterns for the same conditions as in FIGS. 17A-17D at different etching depths.

Changing the radius, r, of the round elements (pillars or holes) results in changing the fill factor of the three-dimensional array structure. Increasing the radius, r, increases the fill factor, $\rho=\pi r^2/\Lambda^2$, of the optically dense dielectric in the metamaterial layer for the pillar embodiments. As a result, the phase increment on transmission increases with radius, as shown in FIG. 15. The deeper the etching, the stronger the OPD. In particular, for about a 1 μm etch depth, the amplitude of the phase mask OPD reaches about one wave, $\Delta\phi\approx2\pi$. Under this condition (one wave OPD phase mask), a physical lens size on the order of the first Fresnel zone is sufficient to focus light in a spot size much smaller that the lens size.

Figure 16:
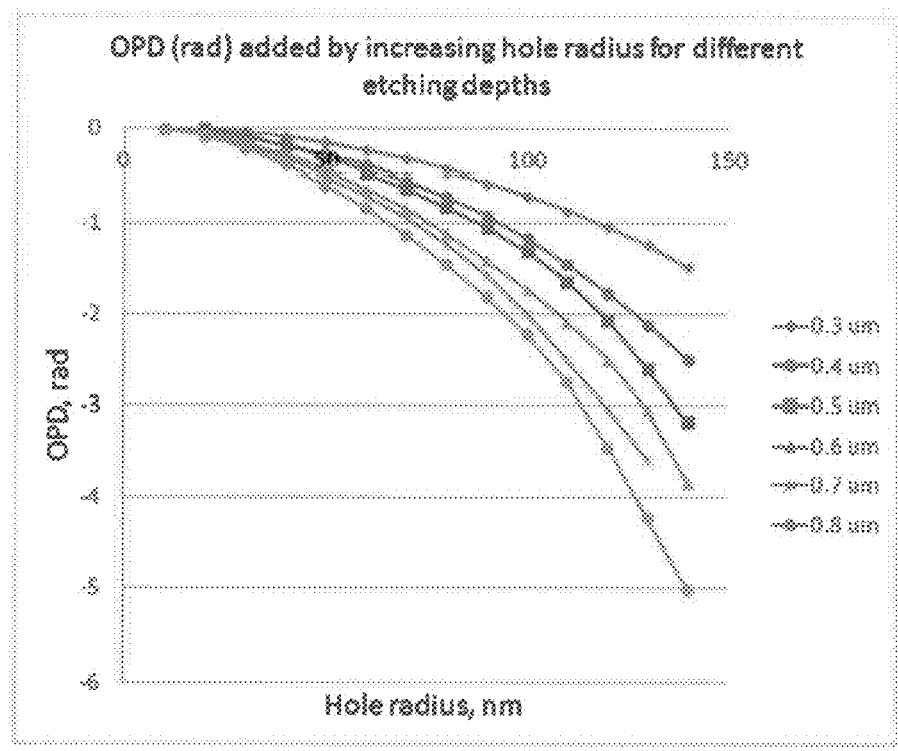
FIG. 16 is a chart of OPD of transmitted light for rectangular symmetry hole patterns for the same conditions as in FIGS. 18A-18D at different etching depths.

Similarly, as shown in FIG. 16, the phase mask strength is reduced with increasing hole radius, since the fill factor, $\rho=1-\pi r^2/\Lambda^2$, for the hole pattern decreases. Moderate variations of the hole radius give stronger phase variations for hole radii exceeding 100 nm. Phase masks with wavelength-scale OPD can also be achieved by varying the etching depth, as shown in FIG. 16.

Figure 17A:
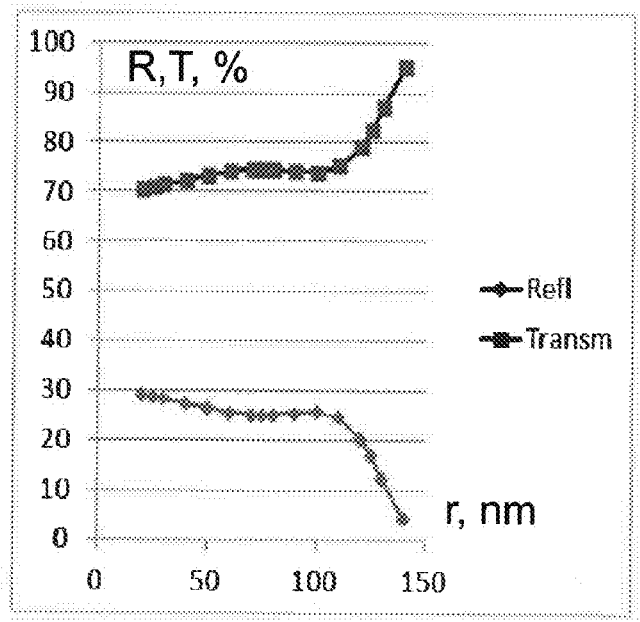
FIG. 17A is a chart of reflectivity and transmissivity for the pattern of pillars of FIG. 8A, for pillar spacing ($\Lambda$)=300 nm and incident radiation wavelength ($\lambda$)=1.55 μm as a function of pillar radius (in nm) for an etching depth of 0.3 μm.
Figure 17B:
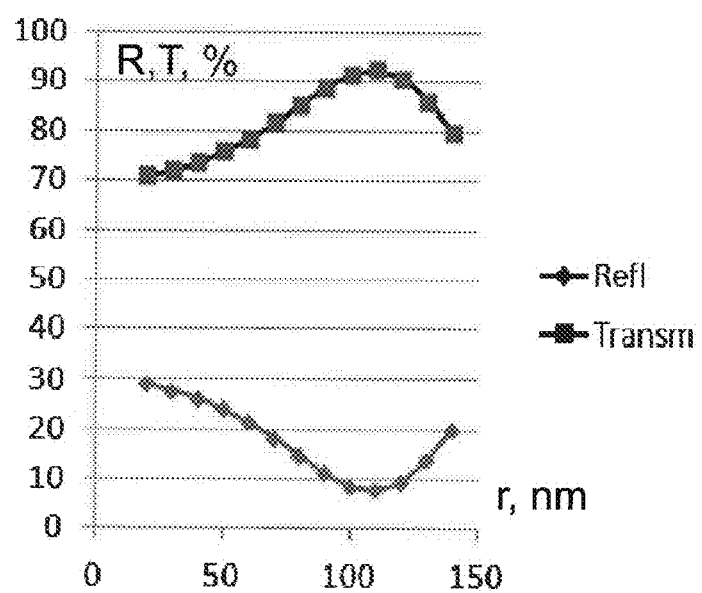
FIG. 17B is a chart of reflectivity and transmissivity for the pattern of pillars of FIG. 8A, for $\Lambda$=300 nm and $\lambda$=1.55 μm as a function of pillar radius (in nm) for an etching depth of 0.5 μm.
Figure 17C:
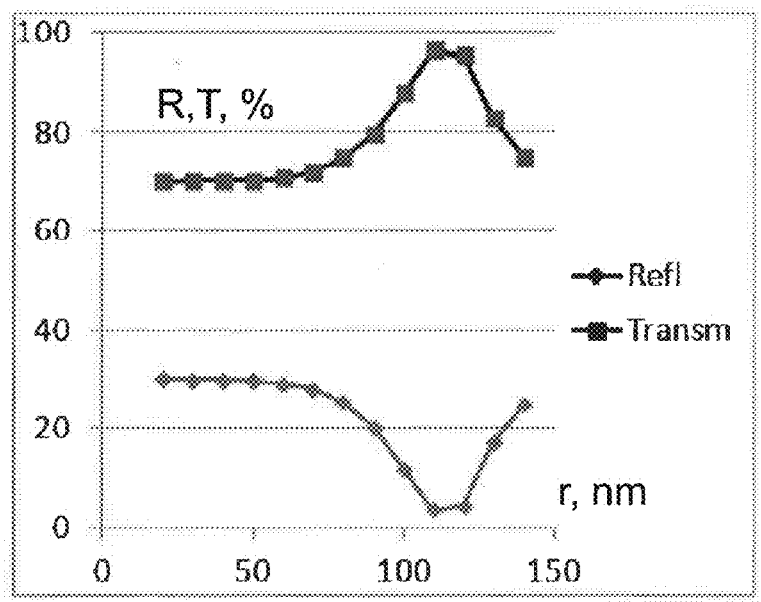
FIG. 17C is a chart of reflectivity and transmissivity for the pattern of pillars of FIG. 8A, for $\Lambda$=300 nm and $\lambda$=1.55 μm as a function of pillar radius (in nm) for an etching depth of 0.7 μm.
Figure 17D:
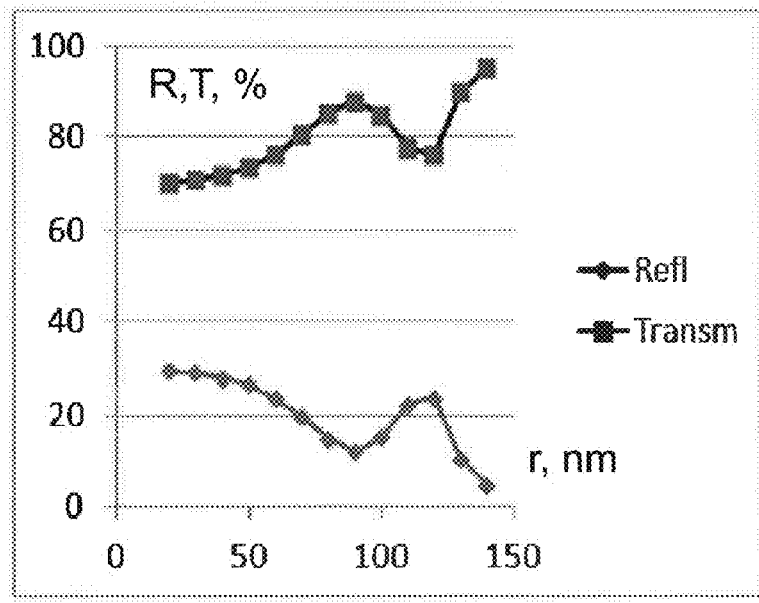
FIG. 17D is a chart of reflectivity and transmissivity for the pattern of pillars of FIG. 8A, for $\Lambda$=300 nm and $\lambda$=1.55 μm as a function of pillar radius (in nm) for an etching depth of 0.9 μm.
Figure 18A:
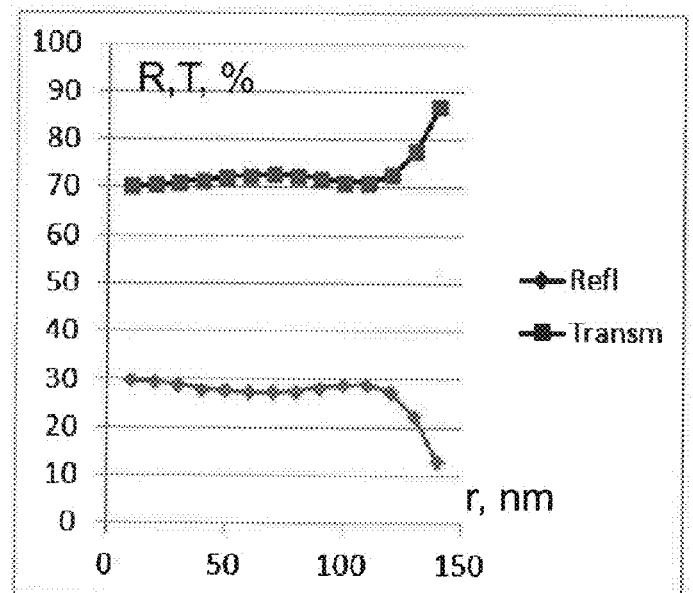
FIG. 18A is a chart of reflectivity and transmissivity for the pattern of round holes of FIG. 9A, for hole spacing ($\Lambda$)=300 nm and incident radiation wavelength ($\lambda$)=1.55 μm as a function of hole radius (in nm) for an etching depth of 0.3 μm.
Figure 18B:
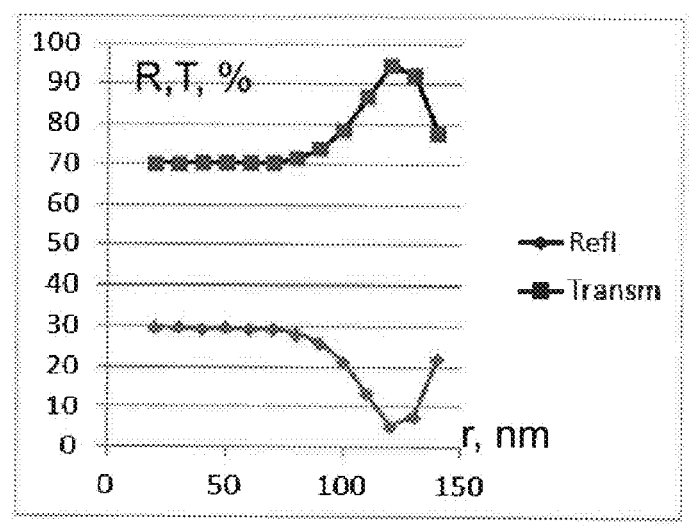
FIG. 18B is a chart of reflectivity and transmissivity for the pattern of round holes of FIG. 9A, for $\Lambda$=300 nm and $\lambda$=1.55 μm as a function of hole radius (in nm) for an etching depth of 0.5 μm.
Figure 18C:
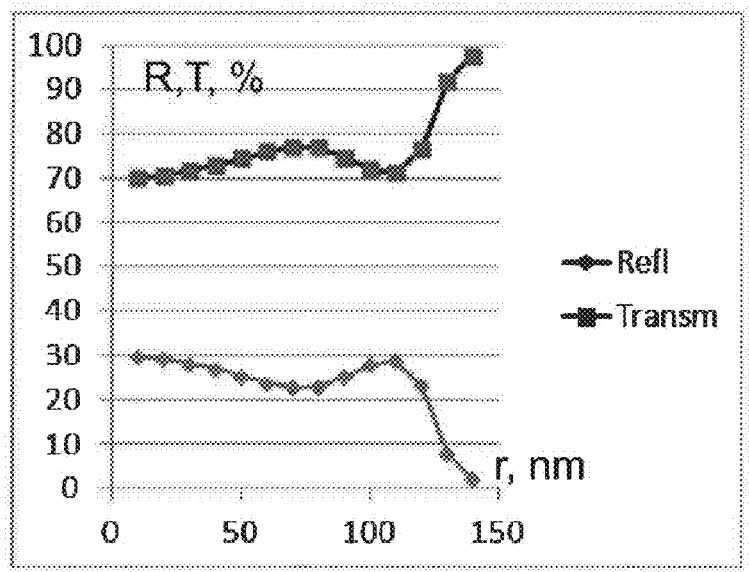
FIG. 18C is a chart of reflectivity and transmissivity for the pattern of round holes of FIG. 9A, for $\Lambda$=300 nm and $\lambda$=1.55 μm as a function of hole radius (in nm) for an etching depth of 0.6 μm.
Figure 18D:
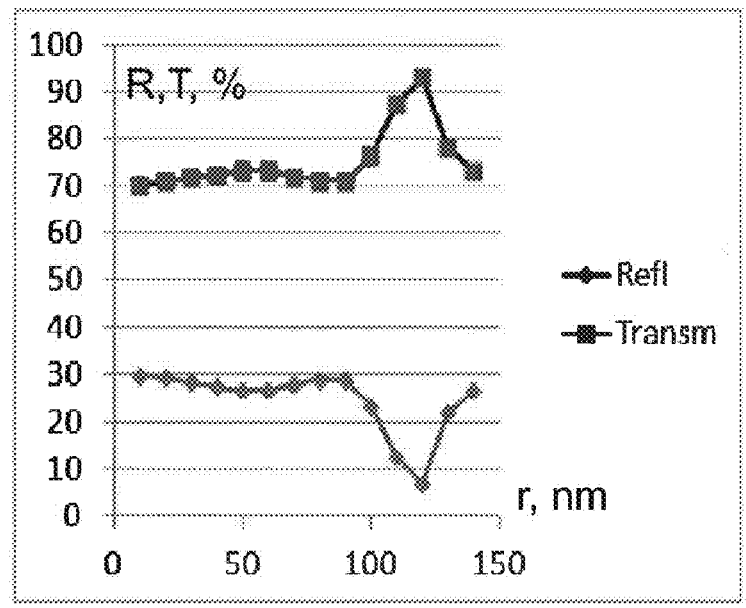
FIG. 18D is a chart of reflectivity and transmissivity for the pattern of round holes of FIG. 9A, for $\Lambda$=300 nm and $\lambda$=1.55 μm as a function of hole radius (in nm) for an etching depth of 0.8 μm.

FIGS. 17A-D and FIGS. 18A-D show modeling results for the variations in reflectivity (Refl) and transmissivity (Transm) of the dielectric metamaterial layers as a function of feature radius, r. FIGS. 17A-D show the results for rectangular arrays of pillars, at etching depths of 0.3 μm (FIG. 17A), 0.5 μm (FIG. 17B), 0.7 μm (FIG. 17C), and 0.9 μm (FIG. 17D). Similar results are presented in FIGS. 18A-D for rectangular arrays of holes at etching depths of 0.3 μm (FIG. 18A), 0.5 μm (FIG. 18B), 0.6 μm (FIG. 18C), and 0.8 μm (FIG. 18D). The variations in reflectivity and transmissivity are complementary, such that the incident power is conserved and redistributed between reflected and transmitted portions, indicating that the loss due to scattering (related to excitation of higher modes of the fine pattern) is negligibly small for the conditions of interest. Both parameters vary with radius due to interference of the reflected waves from the two interfaces. This interference phase changes with the effective refractive index of the fundamental mode with fill factor since the roundtrip phase, $2\pi n_{eff}h/\lambda$, of the light circulating between FP reflectors changes too. Because the roundtrip phase is proportional to the gap width, h, between the FP reflectors, the radius where reflection reaches a minimum is different for different etching depths.

To optimize a final lens design, it may be advantageous to minimize reflection losses over most, if not all, of the lens area. As discussed above, some embodiments of the micro-lens may include a radial variation in the fine structure pattern from lens center to the periphery to create a focusing phase mask. The roundtrip phase for the mode, $2\pi n_{eff}h/\lambda$, also changes with distance from the lens center. This radial variation in some embodiments affects the anti-reflection performance, as it can be difficult to achieve destructive interference on reflection everywhere across the whole lens surface. It is possible, however, to achieve a low overall insertion loss by designing the pattern so that a large portion of the lens area lies near the reflectivity minima of FIGS. 17A-D and FIGS. 18A-D. Iterative design methodologies may be used to achieve the lowest reflective loss by varying these design parameters.

FIGS. 17A-D and FIGS. 18A-D show that the widths of the reflectivity minima (as a function of the pattern characteristics—radius in this particular example) depend on the etching depth, h. The reflectivity minima become narrower as layer thickness, h, increases. A design tradeoff exists, therefore, between (1) deep etching which increases the strength of the phase mask, making it easier to achieve the desired strong focus, and (2) shallow etching which broadens the reflectivity minima, making it easier to achieve low reflection loss across the lens surface, and also reducing manufacturing tolerance.

Figure 19:
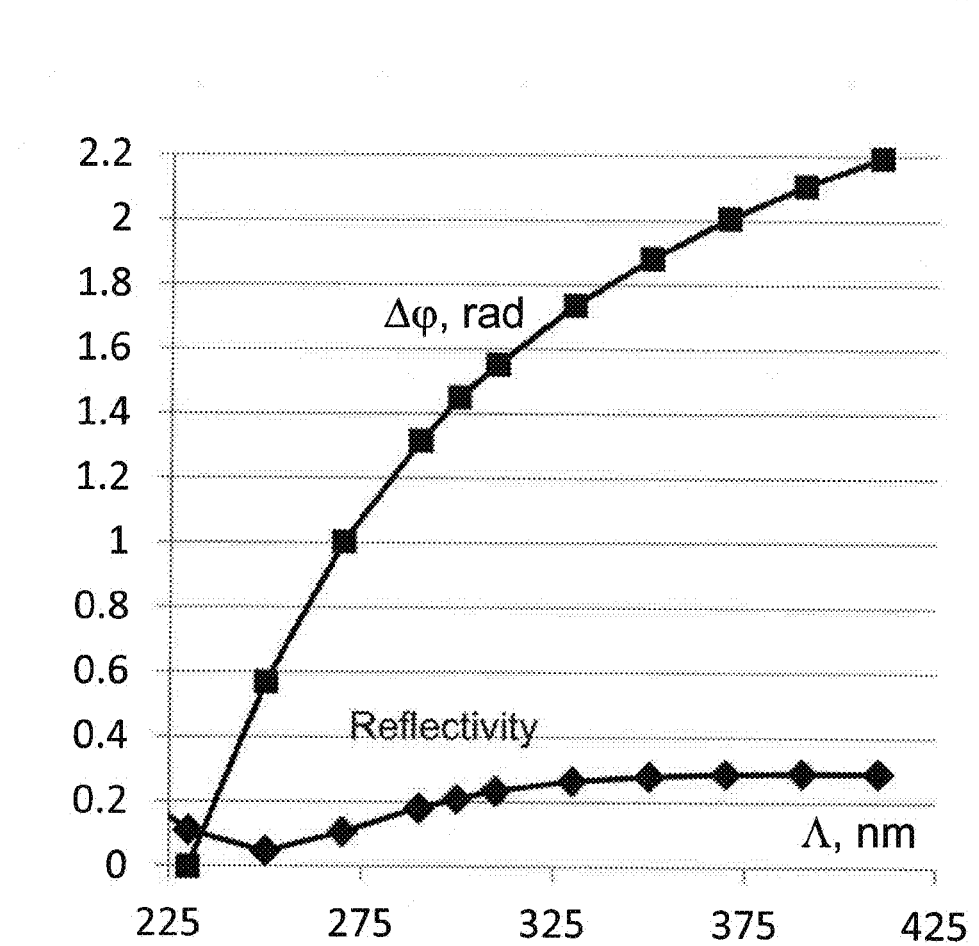
FIG. 19 is a chart of reflectivity and OPD versus spacing (in nm) for a square symmetry pattern of round holes of radius R=100 nm at etching depth 0.5 μm and at $\lambda$=1.55 μm.

The HFSS tool was used to optimize an example of a design of a micro-lens for reflective loss and phase mask amplitude as a function of the spacing between the holes for square array at $\lambda=1.55$ μm, for several different hole radii and etching depths, assuming the cylindrical holes are etched at normal incidence form the air side. FIG. 19 illustrates the results for reflectivity and phase mask amplitude are presented as a function of hole separation, $\Lambda$, for the array of holes located at the nodes of the pattern of adjacent squares, assuming r=100 nm and h=0.5 μm. FIG. 19 demonstrates that for this selection of hole radius, a phase mask amplitude variation of $3\pi/4$ can be achieved if the spacing between the holes is varied from about 230 nm to about 420 nm. Multi-bouncing interference in the metamaterial layer reduces the local reflectivity of the layer from about 30% to 4% for a spacing variation from 420 nm to 250 nm value.

As illustrated by the graph in FIG. 5 and discussed above, the effective index of the layer mode is most sensitive to fill factor, $\rho$, variations for small values of $\rho$, for example, $\rho$ less than about 0.3. Therefore, better control over phase mask amplitude within the same range, for example, $\rho$ less than about 0.3, may be achieved where the fill factor is small. Small fill factor for pillar patterns refers to pillar diameters smaller than about half of the spacing, $r<\Lambda/2$. For this condition, the etching depth is only weakly dependent on the radius of the pillar. The fill factor can be controlled by varying the pillar radius but leaving the pillar spacing fixed without adversely affecting the other design parameters. This approach may have the advantage that the original symmetry of the array is not adversely affected.

Figure 20:
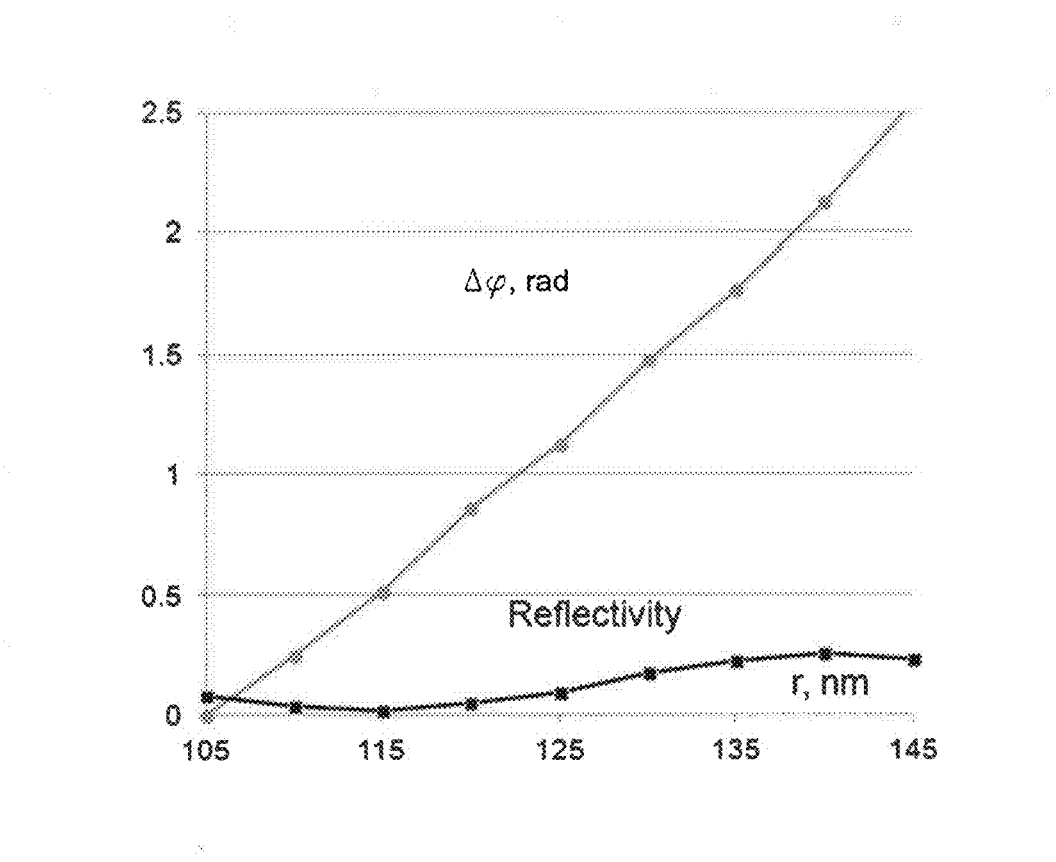
FIG. 20 is a chart of reflectivity and OPD versus pillar radius r (in nm) for a square pattern of round pillars with fixed pattern periodicity $\Lambda$=300 nm at etching depth 0.7 μm and at $\lambda$=1.55 μm.

The reflectivity and phase mask amplitude versus pillar radius were analyzed for a square array geometry at several different pillar spacings and etching depths. FIG. 20 shows corresponding HFSS simulations results for an etching depth of 0.7 μm and a fixed spacing Λ=300 nm at λ=1.55 μm wavelength radiation. FIG. 20 demonstrates that a gradual increase in the fill factor resulting from the increase in pillar radius from 110 nm to 140 nm produces a phase mask amplitude variation of about a quarter wave. The reflectivity drops from about 30% to about 2% with a radius variation from 140 nm to 115 nm.

The simulation results shown in FIGS. 19 and 20 provide information to facilitate micro-lens designs using hole and pillar patterns, respectively. For both designs, the layer fill factor is greatest at the lens center and decreases gradually to the sides. Specific parameters for both designs are selected to provide, simultaneously, maximal OPD near the center yet low reflectivity across much of the lens area. The higher reflectivity region is concentrated near the lens center and occupies a relatively small portion of the lens surface area.

Having thus described several aspects of at least one embodiment of this invention, it is to be appreciated various alterations, modifications, and improvements will readily occur to those skilled in the art. For example, micro-lens designs according to aspects and embodiments are not limited to pillars and/or holes, and may be implemented using any of numerous three-dimensional fine structure patterns, as discussed above. Such and other alterations, modifications, and improvements are intended to be part of this disclosure, and are intended to be within the scope of the invention. Accordingly, the foregoing description and drawings are by way of example only.

What is claimed is:

1. An electromagnetic radiation sensor comprising:
    a dielectric substrate including a front surface and a rear surface; and
    a plurality of pixels, each pixel including:
        an electromagnetic radiation detector element disposed on the rear surface of the substrate; and
        a lens comprising a three dimensional polaritonic metamaterial structure including a pattern of features formed in the front surface of the substrate, the lens being configured to focus electromagnetic radiation incident on the front surface of the substrate onto the electromagnetic radiation detector element, wherein the pattern of features forms a layer that is antireflective to at last one frequency of the electromagnetic radiation, and wherein a spacing between adjacent features is less than a wavelength of the electromagnetic radiation.

2. The electromagnetic radiation sensor of claim 1, wherein the pattern of features includes a plurality of one of pillars and holes.

3. The electromagnetic radiation sensor of claim 2, wherein each of the features has a substantially constant diameter.

4. The electromagnetic radiation sensor of claim 3, wherein the spacing between adjacent features varies across the lens.

5. The electromagnetic radiation sensor of claim 4, wherein the pattern of features includes one of a barrel distortion and a pin-cushion distortion.

6. The electromagnetic radiation sensor of claim 2, wherein the spacing between adjacent features is substantially constant across the lens.

7. The electromagnetic radiation sensor of claim 6, wherein a diameter of adjacent features varies across the lens.

8. The electromagnetic radiation sensor of claim 1, wherein the pattern of features includes a plurality of pillars and a height of the varies across the lens.

9. The electromagnetic radiation sensor of claim 1, wherein the electromagnetic radiation detector element comprises one of a photodiode and a microbolometer.

10. The electromagnetic radiation sensor of claim 1, wherein the pattern of features includes a plurality of holes and a depth of the holes varies across the lens.

11. The electromagnetic radiation sensor of claim 1, wherein the dielectric substrate is one of silicon, silicon carbide, and germanium.

12. The electromagnetic radiation sensor of claim 1, wherein, for each pixel, the electromagnetic radiation detector element is smaller than the corresponding pixel.

13. A method of fabricating a pixelated electromagnetic radiation sensor, the method comprising:
    selecting a substrate having a front surface and an opposing rear surface; and
    fabricating a plurality of pixel elements on the substrate, wherein fabricating each pixel element includes:
        disposing an electromagnetic radiation detector element on the rear surface of the substrate; and
        forming a lens configured to focus electromagnetic radiation incident on the front surface of the substrate onto the electromagnetic radiation detector element, including:
            forming a plurality of one of pillars and holes in the front surface of the substrate to produce a pattern of features with substantially constant diameters in the front surface of the substrate, a spacing between adjacent features of the pattern of features being less than a wavelength of the electromagnetic radiation and varying across the lens.

14. The method of claim 13, where selecting the substrate comprises selecting a substrate substantially transparent to a wavelength of electromagnetic radiation to which the electromagnetic radiation detector element is sensitive.

15. The method of claim 13, wherein the pattern of features is formed by etching the front surface of the substrate.

16. The method of claim 13, wherein forming the lens includes forming the plurality of pillars with a height that varies across the lens.

17. The method of claim 13, wherein forming the lens includes forming the plurality of holes with a depth that varies across the lens.

18. A method of fabricating a pixelated electromagnetic radiation sensor, the method comprising:
    selecting a substrate having a front surface and an opposing rear surface; and
    fabricating a plurality of pixel elements of the substrate, wherein fabricating each pixel element includes:
        disposing an electromagnetic radiation detector element on the rear surface of the substrate; and
        forming a lens configured to focus electromagnetic radiation incident on the front surface of the substrate onto the electromagnetic radiation detector element, wherein forming the lens includes:
            forming a plurality of one of pillars and holes in the front surface of the substrate to produce a pattern of features in the front surface of the substrate, a spacing between adjacent features of the pattern of features being less than a wavelength of the electromagnetic radiation and being substantially constant across the lens, and wherein a diameter of the adjacent features varies across the lens.

19. The method of claim 18, wherein forming the lens includes forming the plurality of pillars with a height that varies across the lens.

20. The method of claim 18, wherein forming the lens includes forming the plurality of holes with a depth that varies across the lens.

21. The method of claim 18, where selecting the substrate comprises selecting a substrate substantially transparent to the wavelength of electromagnetic radiation.

* * * * *